United States Patent
Funyuu et al.

(10) Patent No.: US 10,665,786 B2
(45) Date of Patent: May 26, 2020

(54) TREATMENT LIQUID CONTAINING IONIC COMPOUND, ORGANIC ELECTRONIC ELEMENT, AND METHOD FOR PRODUCING ORGANIC ELECTRONIC ELEMENT

(71) Applicant: HITACHI CHEMICAL COMPANY, LTD., Tokyo (JP)

(72) Inventors: Shigeaki Funyuu, Tsuchiura (JP); Naoki Asano, Tsukuba (JP); Kenichi Ishitsuka, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 659 days.

(21) Appl. No.: 14/773,490

(22) PCT Filed: Mar. 6, 2014

(86) PCT No.: PCT/JP2014/055838
§ 371 (c)(1),
(2) Date: Sep. 8, 2015

(87) PCT Pub. No.: WO2014/136900
PCT Pub. Date: Sep. 12, 2014

(65) Prior Publication Data
US 2016/0020395 A1    Jan. 21, 2016

(30) Foreign Application Priority Data
Mar. 8, 2013 (JP) .................. 2013-046723

(51) Int. Cl.
*H01L 51/00* (2006.01)
*C08G 61/12* (2006.01)
(Continued)

(52) U.S. Cl.
CPC ............ *H01L 51/005* (2013.01); *C08G 61/12* (2013.01); *C08G 65/18* (2013.01); *C08G 65/22* (2013.01);
(Continued)

(58) Field of Classification Search
None
See application file for complete search history.

(56) References Cited

U.S. PATENT DOCUMENTS

| 6,605,823 B1 | 8/2003 | Pichler et al. |
| 9,583,714 B2 | 2/2017 | Funyuu et al. |

(Continued)

FOREIGN PATENT DOCUMENTS

| CN | 1930921 A | 3/2007 |
| CN | 101128560 A | 2/2008 |

(Continued)

OTHER PUBLICATIONS

International Search Report for International Application No. PCT/JP2014/055838 dated Jun. 17, 2014.
(Continued)

*Primary Examiner* — Jay Yang
(74) *Attorney, Agent, or Firm* — Fitch, Even, Tabin & Flannery, LLP

(57) ABSTRACT

An embodiment of the present invention relates to a treatment liquid which contains an ionic compound and a solvent, and is used for adhering the ionic compound to at least one surface selected from the group consisting of a surface on which a layer having hole transport properties is to be formed, and a surface of a layer having hole transport properties.

15 Claims, 4 Drawing Sheets

(51) Int. Cl.
*C08G 65/22* (2006.01)
*C08G 65/18* (2006.01)
*H01L 51/50* (2006.01)
*H01L 51/42* (2006.01)

(52) U.S. Cl.
CPC ...... *H01L 51/0003* (2013.01); *H01L 51/0065* (2013.01); *C08G 2261/135* (2013.01); *C08G 2261/312* (2013.01); *C08G 2261/3142* (2013.01); *C08G 2261/3162* (2013.01); *C08G 2261/3223* (2013.01); *C08G 2261/3241* (2013.01); *C08G 2261/3246* (2013.01); *C08G 2261/411* (2013.01); *C08G 2261/512* (2013.01); *C08G 2261/5222* (2013.01); *C08G 2261/76* (2013.01); *C08G 2261/794* (2013.01); *C08G 2261/95* (2013.01); *H01L 51/0043* (2013.01); *H01L 51/42* (2013.01); *H01L 51/5056* (2013.01); *H01L 51/5088* (2013.01)

(56) References Cited

U.S. PATENT DOCUMENTS

| | | | | |
|---|---|---|---|---|
| 2004/0150330 | A1* | 8/2004 | Suh | H01L 51/5052 313/506 |
| 2006/0108578 | A1* | 5/2006 | Liu | H01L 51/441 257/40 |
| 2006/0228543 | A1* | 10/2006 | Lu | B82Y 10/00 428/323 |

FOREIGN PATENT DOCUMENTS

| | | |
|---|---|---|
| CN | 100486396 C | 5/2009 |
| CN | 101945925 A | 1/2011 |
| CN | 102105507 A | 6/2011 |
| CN | 102105511 A | 6/2011 |
| CN | 102119348 A | 7/2011 |
| CN | 102449799 A | 5/2012 |
| CN | 102576812 A | 7/2012 |
| CN | 102791768 A | 11/2012 |
| CN | 102859740 A | 1/2013 |
| EP | 1725079 A1 | 11/2006 |
| EP | 1857521 A1 | 11/2007 |
| EP | 2270069 A1 | 1/2011 |
| EP | 2311894 A1 | 4/2011 |
| EP | 2314639 A1 | 4/2011 |
| EP | 2439804 A1 | 4/2012 |
| EP | 2535366 A1 | 12/2012 |
| EP | 2562839 A1 | 2/2013 |
| EP | 2762514 A1 | 8/2014 |
| EP | 2787550 A1 | 10/2014 |
| EP | 2787551 A1 | 10/2014 |
| JP | 2006233162 A | 9/2006 |
| JP | 2010141059 A | 6/2010 |
| JP | 2011-105790 A | 6/2011 |
| JP | 2012190880 A | 10/2012 |
| JP | 2012193312 A | 10/2012 |
| JP | 2012253067 A | 12/2012 |
| TW | 201125888 A1 | 8/2011 |
| WO | 2010074331 A1 | 7/2010 |
| WO | 2010104184 A1 | 9/2010 |
| WO | 201104531 A1 | 4/2011 |

OTHER PUBLICATIONS

Office Action of TW 103107932 dated Jun. 2, 2015 with English translation.
Office Action of Chinese Patent Application No. 201480013004.1 dated Jun. 21, 2016 with English translation.
Search Report of European application No. 14760766.7 dated Nov. 8, 2016 in English.
Office Action of CN Appln. No. 201480013004.1 dated Feb. 4, 2017 with English translation.
Search Report for counterpart Taiwan Patent Application No. 105121593 dated Feb. 20, 2017 in English.
Office Action of counterpart Chinese Patent Application No. 201480013004.1 dated Aug. 23, 2017 with English translation.
Office Action in Taiwan Appln. No. 103107932 dated May 4, 2016 with English translation.

* cited by examiner (a)

(b)

(c1)

(c2)

(a)

(b)

(c1)

(c2)

TREATMENT LIQUID CONTAINING IONIC COMPOUND, ORGANIC ELECTRONIC ELEMENT, AND METHOD FOR PRODUCING ORGANIC ELECTRONIC ELEMENT

TECHNICAL FIELD

Embodiments of the present invention relate to a treatment liquid containing an ionic compound, an organic electronic element, and a method for producing an organic electronic element. Further, other embodiments of the present invention relate to an organic electroluminescent element, a display element, an illumination device, a display device, and an organic photoelectric conversion element.

BACKGROUND ART

Organic electronic elements are elements that use organic substances to perform electrical operations. Organic electronic elements are expected to yield significant advantages, including energy conservation, low price and superior flexibility, and are therefore attracting considerable attention as potential replacements for conventional inorganic semiconductors based mainly on silicon.

Examples of organic electronic elements include organic electroluminescent elements (hereafter also referred to as "organic EL elements"), organic photoelectric conversion elements and organic transistors.

Among organic electronic elements, organic EL elements are attracting attention as potential large-surface area solid state light sources for use instead of incandescent lamps or gas-filled lamps or the like. Further, organic EL elements are also attracting much attention as the leading candidate for light-emitting displays that can replace liquid crystal displays (LCD) used in the field of flat panel displays (FPD), and actual production of such light-emitting displays is now proceeding.

In organic EL elements, research is currently being conducted into the use of a layer having charge transport properties, such as a charge injection layer or charge transport layer, between the light-emitting layer and the anode, for the purpose of improving the properties of the element such as the light emission efficiency or the lifespan of the element.

Further, the production processes for organic EL elements can be broadly classified into dry processes that use vacuum deposition or the like, and wet processes that use printing with inkjet technology or the like. Wet processes enable the size of the organic EL element to be increased more easily, and are also thought to provide higher productivity.

Examples of known organic EL elements include those mentioned below.

Patent Document 1 discloses an organic EL element which includes, between the light-emitting layer and the anode, an anode protective layer formed from a polyethylene dioxythiophene (PEDT) and a polystyrene sulfonate (PSS).

Patent Document 2 discloses an organic EL element which includes, between the light-emitting layer and the anode, a hole injection layer and/or a hole transport layer formed using a charge transport film composition containing a charge transport compound and an ionic compound.

CITATION LIST

Patent Literature

PLT1: JP 3724589 B1
PLT2: JP 2006-233162 A

SUMMARY OF INVENTION

Technical Problem

An object of one embodiment of the present invention is to provide a treatment liquid that is capable of improving the properties of a layer having hole transport properties. Further, an object of another embodiment of the present invention is to provide an organic electronic element having excellent properties and a method for producing the element. Moreover, objects of other embodiments of the present invention are to provide an organic electroluminescent element, a display element, an illumination device, a display device and an organic photoelectric conversion element having excellent properties.

Solution to Problem

As a result of intensive research, the inventors of the present invention discovered that by performing a simple treatment, either before or after the formation of a layer having hole transport properties, the properties of an organic electronic element could be improved, and they were thus able to complete the present invention, including a variety of embodiments.

One embodiment of the present invention relates to a treatment liquid which contains an ionic compound and a solvent, and is used for adhering the ionic compound to at least one surface selected from the group consisting of a surface on which a layer having hole transport properties is to be formed, and a surface of a layer having hole transport properties.

Further, another embodiment of the present invention relates to an organic electronic element having an anode, a surface to which an ionic compound is adhered, a layer (A) having hole transport properties, and a cathode, in that order.

Yet another embodiment of the present invention relates to a method for producing an organic electronic element having a step of forming an anode, a step of forming a layer (A) having hole transport properties, and a step of forming a cathode, the method also having at least one step selected from the group consisting of a step of adhering an ionic compound to the surface on which the layer (A) having hole transport properties is to be formed, and a step of adhering an ionic compound to the surface of the layer (A) having hole transport properties. Further, another embodiment of the present invention relates to an organic electronic element produced using the above method.

Other embodiments of the present invention relate to an organic electroluminescent element that uses the above organic electronic element, a display element that includes the organic electroluminescent element, an illumination device that includes the organic electroluminescent element, a display device that includes the above illumination device and a liquid crystal element as a display unit, and an organic photoelectric conversion element that uses the above organic electronic element.

Examples of the above embodiments are presented below.

Examples of the treatment liquid described above include a treatment liquid which contains the ionic compound and the solvent, and is to be applied to the surface on which a layer having hole transport properties is to be formed; a treatment liquid which also contains a compound having a polymerizable substituent; a treatment liquid in which the ionic compound has at least one anion selected from the group consisting of anions represented by any one of formula (1A) to formula (5A) shown below; a treatment liquid in which the ionic compound has at least one cation selected from the group consisting of cations of elements belonging to group 1 or group 2 of the IUPAC Periodic Table of the Elements, and cations represented by any one of formula (1B) to formula (3B) shown below; and a treatment liquid in which the compound having a polymerizable substituent has at least one group selected from the group consisting of an oxetanyl group, epoxy group, vinyl group, vinyl ether group, acrylate group and methacrylate group.

Further, examples of the organic electronic element described above include an organic electronic element in which the surface to which an ionic compound is adhered is a surface to which a treatment liquid containing the ionic compound and a solvent has been applied; an organic electronic element in which the treatment liquid also contains a compound having a polymerizable substituent; an organic electronic element in which the surface to which an ionic compound is adhered is the surface of the anode; an organic electronic element which also includes a layer (B) having hole transport properties between the anode and the layer (A) having hole transport properties, and in which the surface to which an ionic compound is adhered is the surface of the layer (B) having hole transport properties; and an organic electronic element which also includes a light-emitting layer between the layer (A) having hole transport properties and the cathode.

Moreover, examples of the aforementioned method for producing an organic electronic element include a method for producing an organic electronic element in which the step of adhering an ionic compound is a step of applying a treatment liquid containing the ionic compound and a solvent; a method for producing an organic electronic element in which the treatment liquid also contains a compound having a polymerizable substituent; a method for producing an organic electronic element which includes a step of forming an anode, a step of applying a treatment liquid containing an ionic compound and a solvent to the surface of the anode, a step of forming a layer (A) having hole transport properties on the surface of the anode to which the treatment liquid has been applied, and a step of forming a cathode, in that order; a method for producing an organic electronic element which includes a step of forming an anode, a step of forming a layer (B) having hole transport properties, a step of applying a treatment liquid containing an ionic compound and a solvent to the surface of the layer (B) having hole transport properties, a step of forming a layer (A) having hole transport properties on the surface of the layer (B) having hole transport properties to which the treatment liquid has been applied, and a step of forming a cathode, in that order; and a method for producing an organic electronic element which also includes a step of forming a light-emitting layer.

This Application is related to the subject matter disclosed in prior Japanese Application 2013-046723 filed on Mar. 8, 2013, the entire contents of which are incorporated by reference herein.

Advantageous Effects of Invention

One embodiment of the present invention is able to provide a treatment liquid that is capable of improving the properties of a layer having hole transport properties. Further, another embodiment of the present invention is able to provide an organic electronic element having excellent properties and a method for producing the element. Moreover, other embodiments of the present invention are able to provide an organic electroluminescent element, a display element, an illumination device, a display device and an organic photoelectric conversion element having excellent properties.

BRIEF DESCRIPTION OF DRAWINGS

FIG. 1(a) to FIG. 1(c2) are schematic plan views illustrating: (a) an example of an anode, (b) an example of a continuous coating film, and (c1) and (c2) examples of coating films having non-continuous portions.

FIG. 2(a) to FIG. 2(c2) are schematic cross-sectional views illustrating: (a) an example of an anode, (b) an example of a continuous coating film, and (c1) and (c2) examples of coating films having non-continuous portions.

DESCRIPTION OF EMBODIMENTS

Figure 1:
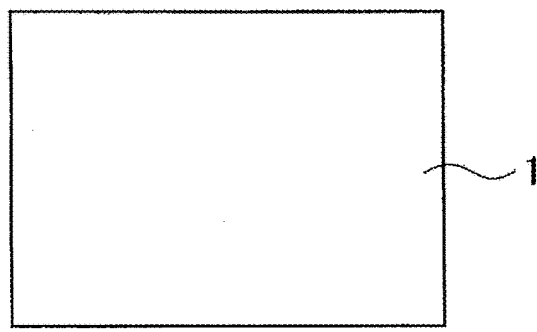
Figure 1:
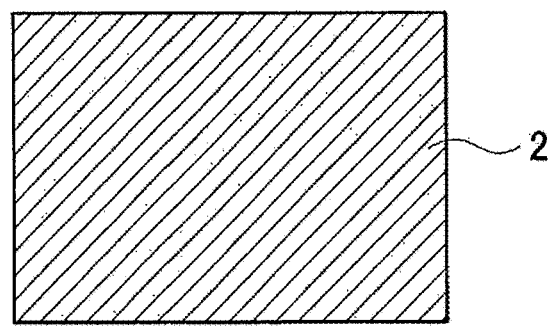
Figure 1:
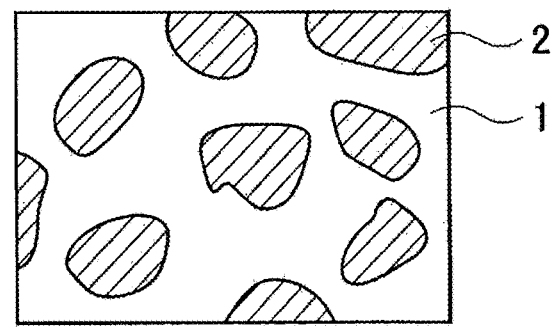
Figure 1:
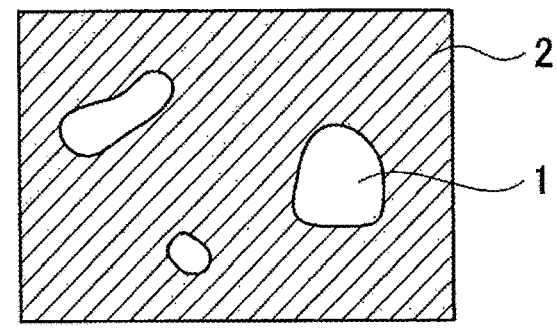

Embodiments of the present invention are described below.

[Treatment Liquid]

The treatment liquid contains an ionic compound and a solvent. The treatment liquid may also contain a compound having a polymerizable substituent.

The treatment liquid is used for adhering the ionic compound to a surface on which a layer having hole transport properties is to be formed, a surface of a layer having hole transport properties, or both these types of surfaces. The treatment liquid is, for example, to be applied to a surface on which a layer having hole transport properties is to be formed. Examples of the layer having hole transport properties include a hole injection layer or a hole transport layer in an organic EL element, and a buffer layer in an organic photoelectric conversion element. Examples of the surface on which a layer having hole transport properties is to be formed include the surface of an anode and the surface of another layer having hole transport properties. Details relating to the layer having hole transport properties and the anode are described below.

[Ionic Compound]

The ionic compound is a compound having at least one anion and at least one cation. The ionic compound typically includes the anion(s) and the cation(s) in a state where the charges of the anion(s) and the cation(s) are balanced. The treatment liquid may contain only a single ionic compound, or may contain two or more ionic compounds. The anion and cation are described below in further detail, but the anion and the cation are not limited to the examples presented below.

[Anion]

The ionic compound preferably has an anion with an electron-withdrawing substituent, and more preferably has at least one anion selected from the group consisting of anions represented by any one of formula (1A) to formula (5A) shown below.

[Chemical Formula 1]

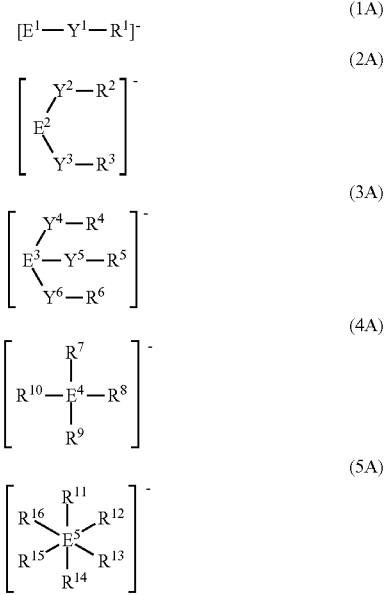

(1A) $[E^1\text{—}Y^1\text{—}R^1]^-$ (2A)–(5A) shown in figure

In the formulas, $E^1$ represents an oxygen atom, $E^2$ represents a nitrogen atom, $E^3$ represents a carbon atom, $E^4$ represents a boron atom or a gallium atom, and $E^5$ represents a phosphorus atom or an antimony atom, each of $Y^1$ to $Y^6$ independently represents a single bond or a divalent linking group, and each of $R^1$ to $R^{16}$ independently represents an electron-withdrawing monovalent group (wherein $R^2$ and $R^3$, at least two groups selected from among $R^4$ to $R^6$, at least two groups selected from among $R^7$ to $R^{10}$, and at least two groups selected from among $R^{11}$ to $R^{16}$ may be bonded together).

In formula (1A) to formula (5A), each of $R^1$ to $R^{16}$ independently represents an electron-withdrawing monovalent group. The electron-withdrawing monovalent group is a substituent which, compared with a hydrogen atom, withdraws electrons more readily from atoms bonded to the substituent. $R^1$ to $R^{16}$ are preferably organic groups. An organic group is an atom grouping containing one or more carbon atoms. This definition of an organic group also applies below. $R^2$ and $R^3$, at least two groups selected from among $R^4$ to $R^6$, at least two groups selected from among $R^7$ to $R^{10}$, and at least two groups selected from among $R^{11}$ to $R^{16}$ may be bonded together. The bonded groups may form a ring.

Specific examples of the electron-withdrawing monovalent group include halogen atoms such as a fluorine atom, chlorine atom and bromine atom; a cyano group; a thiocyano group; a nitro group; alkylsulfonyl groups (typically having a carbon number of 1 to 12, and preferably a carbon number of 1 to 6) such as a mesyl group; arylsulfonyl groups (typically having a carbon number of 6 to 18, and preferably a carbon number of 6 to 12) such as a tosyl group; alkyloxysulfonyl groups (typically having a carbon number of 1 to 12, and preferably a carbon number of 1 to 6) such as a methoxysulfonyl group; aryloxysulfonyl groups (typically having a carbon number of 6 to 18, and preferably a carbon number of 6 to 12) such as a phenoxysulfonyl group; acyl groups (typically having a carbon number of 1 to 12, and preferably a carbon number of 1 to 6) such as a formyl group, acetyl group and benzoyl group; acyloxy groups (typically having a carbon number of 1 to 20, and preferably a carbon number of 1 to 6) such as a formyloxy group and an acetoxy group; alkoxycarbonyl groups (typically having a carbon number of 2 to 10, and preferably a carbon number of 2 to 7) such as a methoxycarbonyl group and an ethoxycarbonyl group; aryloxycarbonyl groups or heteroaryloxycarbonyl groups (typically having a carbon number of 4 to 25, and preferably a carbon number of 5 to 15) such as a phenoxycarbonyl group and a pyridyloxycarbonyl group; haloalkyl groups, haloalkenyl groups and haloalkynyl groups (typically having a carbon number of 1 to 10, and preferably a carbon number of 1 to 6) in which a linear, branched or cyclic alkyl group, alkenyl group or alkynyl group has been substituted with one or more halogen atoms, such as a trifluoromethyl group and a pentafluoroethyl group; haloaryl groups (typically having a carbon number of 6 to 20, and preferably a carbon number of 6 to 12) in which an aryl group has been substituted with one or more halogen atoms, such as a pentafluorophenyl group; and haloarylalkyl groups (typically having a carbon number of 7 to 19, and preferably a carbon number of 7 to 13) in which an arylalkyl group has been substituted with one or more halogen atoms, such as a pentafluorophenylmethyl group.

An aryl group is an atom grouping in which one hydrogen atom has been removed from an aromatic hydrocarbon. The term aromatic hydrocarbon includes compounds having condensed rings. Further, the term aromatic hydrocarbon also includes compounds in which two or more independent single rings or condensed rings are bonded together directly (via a single bond) or via a group such as a vinylene group. A heteroaryl group is an atom grouping in which one hydrogen atom has been removed from an aromatic compound having a hereto atom. The term aromatic compound includes compounds having condensed rings. Further, the term aromatic compound also includes compounds in which two or more independent single rings or condensed rings are bonded together directly or via a group such as a vinylene group. These definitions of an aryl group and a heteroaryl group also apply below.

Moreover, from the viewpoint of enabling efficient delocalization of the negative charge, examples of preferred electron-withdrawing monovalent groups include groups in which some or all of the hydrogen atoms of an "organic group having hydrogen atoms" selected from among the examples of electron-withdrawing monovalent groups mentioned above have each been substituted with a halogen atom. Specific examples of such groups include perfluoroalkylsulfonyl groups, perfluoroarylsulfonyl groups, perfluoroalkyloxysulfonyl groups, perfluoroaryloxysulfonyl groups, perfluoroacyl groups, perfluoroacyloxy groups, perfluoroalkoxycarbonyl groups, perfluoroaryloxycarbonyl groups, perfluoroalkyl groups, perfluoroalkenyl groups, perfluoroalkynyl groups, perfluoroaryl groups, and perfluoroarylalkyl groups.

Particularly preferred electron-withdrawing monovalent groups include linear or branched perfluoroalkyl groups having a carbon number of 1 to 8, cyclic perfluoroalkyl groups having a carbon number of 3 to 6, and perfluoroaryl groups having a carbon number of 6 to 18.

The electron-withdrawing monovalent group is not limited to the groups described above. The examples of the electron-withdrawing monovalent group mentioned above may further include a substituent or a hetero atom.

Specific examples of the electron-withdrawing monovalent group include the groups of a substituent group (1) shown below.

<Substituent Group (1)>

[Chemical Formula 2]

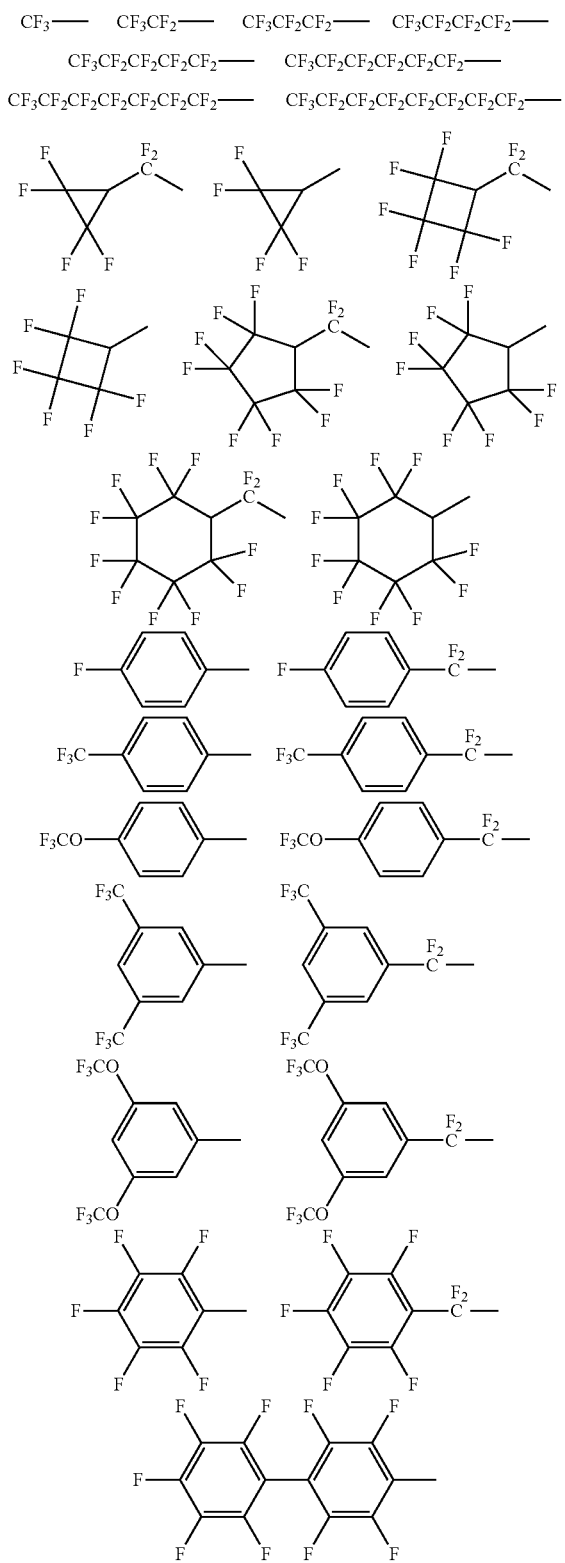

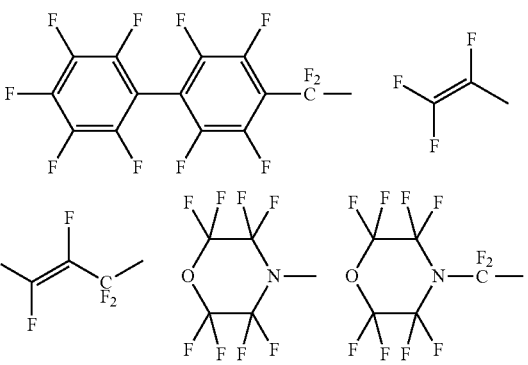

In formulas (1A) to (5A), each of $Y^1$ to $Y^6$ independently represents a single bond or a divalent linking group. The cases where $Y^1$ to $Y^6$ represent single bonds describe those cases where E and R are bonded together directly. Examples of the divalent linking group include groups represented by any one of formulas (1c) to (11c) shown below.

[Chemical Formula 3]

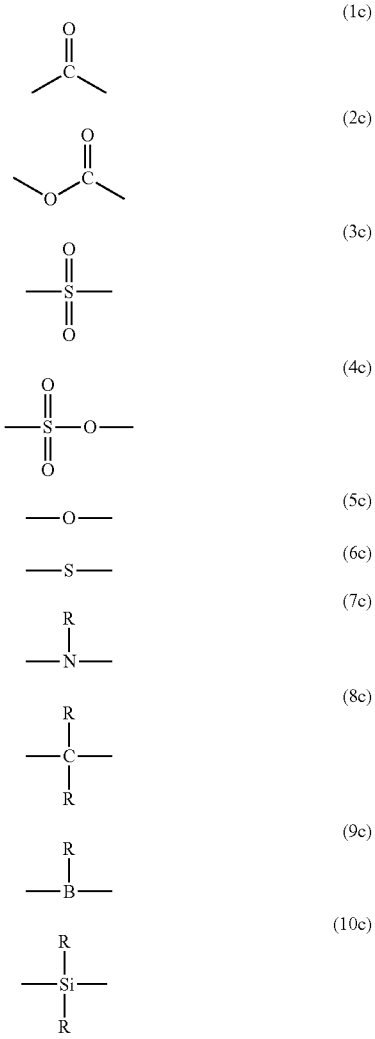

-continued

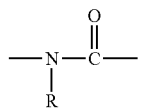
(11c)

In the above formulas, each R independently represents a hydrogen atom or a monovalent group.

R is preferably an organic group. From the viewpoints of enhancing the electron-accepting properties and improving the solubility in the solvent and the like, each R preferably independently represents an alkyl group, alkenyl group, alkynyl group, aryl group or heteroaryl group. These groups may have a substituent, and may include a hetero atom. Further, R is preferably an electron-withdrawing monovalent group, and examples of the electron-withdrawing monovalent group include the examples of electron-withdrawing monovalent groups mentioned above, and the groups shown in the above substituent group (1).

The anion is preferably an anion in which the negative charge resides mainly on an oxygen atom, nitrogen atom, carbon atom, boron atom or gallium atom, and is more preferably an anion in which the negative charge resides mainly on an oxygen atom, nitrogen atom, carbon atom or boron atom. Specific examples include anions represented by formulas (6A) to (9A) shown below.

[Chemical Formula 4]

(6A)

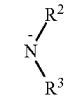
(7A)

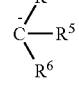
(8A)

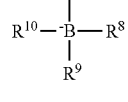
(9A)

In the above formulas, each of $R^1$ to $R^{10}$ independently represents an electron-withdrawing monovalent group (wherein $R^2$ and $R^3$, at least two groups selected from among $R^4$ to $R^6$, and at least two groups selected from among $R^7$ to $R^{10}$, may be bonded together).

$R^1$ to $R^{10}$ are preferably organic groups. Examples of the electron-withdrawing monovalent group include the examples of electron-withdrawing monovalent groups mentioned above, and the groups shown in the above substituent group (1). A group from the above substituent group (1) is preferred.

[Cation]

The ionic compound preferably has at least one cation selected from the group consisting of cations of elements belonging to group 1 or group 2 of the IUPAC Periodic Table of the Elements (version date: 1 Jun. 2012, this also applies below), and cations represented by any one of formula (1B) to formula (3B) shown below. It is more preferable that the ionic compound has a cation represented by one of formula (1B) to formula (3B).

[Chemical Formula 5]

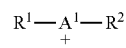
(1B)

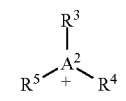
(2B)

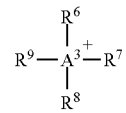
(3B)

In the above formulas, $A^1$ represents an element belonging to group 17 or group 14 of the IUPAC Periodic Table of the Elements, $A^2$ represents an element belonging to group 16 or group 14 of the IUPAC Periodic Table of the Elements, $A^3$ represents an element belonging to group 15 of the IUPAC Periodic Table of the Elements, and each of $R^1$ to $R^9$ independently represents a hydrogen atom or an organic group (wherein $R^1$ and $R^2$, at least two groups selected from among $R^3$ to $R^5$, and at least two groups selected from among $R^6$ to $R^9$ may be bonded together).

Each of $R^1$ to $R^9$ independently represents a hydrogen atom or an organic group. From the viewpoint of factors such as the stability of the ionic compound and the solubility in the solvent, each of $R^1$ to $R^9$ preferably independently represents a hydrogen atom, or an alkyl group, alkenyl group, alkynyl group, arylalkyl group, aryl group or heteroaryl group. These groups may also have a substituent. $R^1$ and $R^2$, at least two groups selected from among $R^3$ to $R^5$, and at least two groups selected from among $R^6$ to $R^9$ may be bonded together to form a ring. At least one group selected from among $R^1$ and $R^2$, at least one group selected from among $R^3$ to $R^5$, and at least one group selected from among $R^6$ to $R^9$ are preferably organic groups.

From the viewpoints of the stability and the ease of synthesis and purification of the ionic compound, $A^1$ in formula (1B) is preferably a bromine atom, iodine atom or carbon atom, $A^2$ in formula (2B) is preferably an oxygen atom, carbon atom, sulfur atom or selenium atom, and $A^3$ in formula (3B) is preferably a nitrogen atom, phosphorus atom, arsenic atom, antimony atom or bismuth atom.

Additional specific examples of the cation include cations represented by formula (4B) shown below.

[Chemical Formula 6]

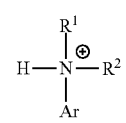
(4B)

In the formula, Ar represents an aryl group or a heteroaryl group, each of $R^1$ and $R^2$ independently represents a hydrogen atom or an alkyl group, benzyl group, aryl group or heteroaryl group, and at least two groups selected from among Ar, $R^1$ and $R^2$ may be bonded together to form a ring.

However, at least one of $R^1$ and $R^2$ is a hydrogen atom, an alkyl group or a benzyl group.

When solubility of the ionic compound in the solvent is considered, at least one of $R^1$ and $R^2$ is preferably an alkyl group or a benzyl group, and compounds in which each of $R^1$ and $R^2$ is either an alkyl group or a benzyl group are particularly preferable. In formula (4B), $R^1$ and $R^2$ cannot both be aryl groups or heteroaryl groups.

Specific examples of $R^1$ and $R^9$ in formulas (1B) to (3B), and $R^1$ and $R^2$ in formula (4B) are described below. However, examples of $R^1$ to $R^9$, $R^1$ and $R^2$, and examples of substituents within these groups are not limited to the examples presented below.

The aforementioned alkyl group may be linear, branched or cyclic, may have a substituent, and has a carbon number that is preferably from 1 to 24, and more preferably from 2 to 18. Specific examples include a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, dodecyl group, tetradecyl group, octadecyl group, 3,7-dimethyloctyl group, lauryl group, trifluoromethyl group, pentafluoroethyl group, perfluorobutyl group, perfluorohexyl group and perfluorooctyl group.

The aforementioned alkenyl group may be linear, branched or cyclic, may have a substituent, and has a carbon number that is preferably from 2 to 12, and more preferably from 2 to 6. Specific examples include a vinyl group, 1-propenyl group, 2-propenyl group, isopropenyl group, 1-butenyl group, 2-butenyl group, 3-butenyl group, 1-octenyl group, 1-decenyl group and 1-octadecenyl group.

The aforementioned alkynyl group may be linear, branched or cyclic, may have a substituent, and has a carbon number that is preferably from 2 to 12, and more preferably from 2 to 6. Specific examples include an ethynyl group, 1-propynyl group, 2-propynyl group, 1-butynyl group, 2-butynyl group, 3-butynyl group, 1-octynyl group, 1-decynyl group and 1-octadecynyl group.

The aforementioned aryl group may have a substituent. The carbon number of the monovalent aryl group in an unsubstituted state is preferably from 6 to 60, and more preferably from 6 to 18. Specific examples include a phenyl group, C1 to C12 alkoxyphenyl groups (here C1 to C12 means that the carbon number of the substituent is from 1 to 12, this numbering system also applies below), C1 to C12 alkylphenyl groups, and a 1-naphthyl group, 2-naphthyl group, 1-anthracenyl group, 2-anthracenyl group, 9-anthracenyl group, phenanthrenyl group, pyrenyl group, perylenyl group and pentafluorophenyl group, and of these, a C1 to C12 alkoxyphenyl group or a C1 to C12 alkylphenyl group is preferred.

Specific examples of the C1 to C12 alkoxy substituent include methoxy, ethoxy, propyloxy, propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy substituents.

Specific examples of the C1 to C12 alkyl substituent include methyl, ethyl, propyl, i-propyl, butyl, i-butyl, t-butyl, pentyl, hexyl, cyclohexyl, heptyl, octyl, 2-ethylhexyl, nonyl, decyl, 3,7-dimethyloctyl and lauryl substituents.

The aforementioned heteroaryl group may have a substituent. The carbon number of the monovalent heteroaryl group in an unsubstituted state is preferably from 4 to 60, and more preferably from 4 to 20. Specific examples include a thienyl group, C1 to C12 alkylthienyl groups, pyrrolyl group, furyl group, pyridyl group and C1 to C12 alkylpyridyl groups, and of these, a thienyl group, C1 to C12 alkylthienyl group, pyridyl group or C1 to C12 alkylpyridyl group is preferred. Examples of the C1 to C12 alkyl substituent are as mentioned above.

The aforementioned arylalkyl group is a group in which at least one hydrogen atom of an alkyl group has been substituted with an aryl group. The arylalkyl group may have a substituent. The carbon number of the monovalent arylalkyl group in an unsubstituted state is preferably from 7 to 19, and more preferably from 7 to 13. Examples of the alkyl group include the alkyl groups mentioned above, and examples of the aryl group include the aryl groups mentioned above. Specific examples of the arylalkyl group include a benzyl group, phenethyl group, naphthylmethyl group, naphthylethyl group and diphenylmethyl group.

Further, the cation of the ionic compound is preferably an iodonium, sulfonium, phosphonium, carbenium (trityl), bismuthonium, ammonium, selenium, oxonium or tropylium ion.

Examples of the iodonium ion include diphenyliodonium, di-p-tolyliodonium, bis(4-dodecylphenyl)iodonium, bis(4-methoxyphenyl)iodonium, (4-octyloxyohenyl)phenyliodonium, bis(4-decyloxyphenyl)iodonium, 4-(2-hydroxytetradecyloxy)phenylphenyliodonium, 4-isopropylphenyl(p-tolyl)iodonium and isobutylphenyl(p-tolyl)iodonium ions. These types of ions are disclosed in Macromolecules, 10, 1307 (1977), JP 6-184170 A, U.S. Pat. Nos. 4,256,828, 4,351,708, JP 56-135519 A, JP 58-38350 A, JP 10-195117 A, JP 2001-139539 A, JP 2000-510516 A, and JP 2000-119306 A and the like.

Examples of the sulfonium ion include triarylsulfonium ions such as triphenylsulfonium, tri-p-tolylsulfonium, tri-o-tolylsulfonium, tris(4-methoxyphenyl)sulfonium, 1-naphthyldiphenylsulfonium, 2-naphthyldiphenylsulfonium, tris(4-fluorophenyl)sulfonium, tri-1-naphthylsulfonium, tri-2-naphthylsulfonium, tris(4-hydroxyphenyl)sulfonium, 4-(phenylthio)phenyldiphenylsulfonium, 4-(p-tolylthio)phenyldi-p-tolylsulfonium, 4-(4-methoxyphenylthio)phenylbis(4-methoxyphenyl)sulfonium, 4-(phenylthio)phenylbis(4-fluorophenyl)sulfonium, 4-(phenylthio)phenylbis(4-methoxyphenyl)sulfonium, 4-(phenylthio)phenyldi-p-tolylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyldiphenylsulfonium, 4-(4-benzoylphenylthio)phenylbis(4-fluorophenyl)sulfonium, 4-(4-benzoylphenylthio)phenyldiphenylsulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(di-p-tolyl)sulfonio]thioxanthone, 2-[(diphenyl)sulfonio]thioxanthone, 4-[4-(4-tert-butylbenzoyl)phenylthio]phenyldi-p-tolylsulfonium, 4-[4-(4-tert-butylbenzoyl)phenylthio]phenyldiphenylsulfonium, 4-[4-(benzoylphenylthio)]phenyldi-p-tolylsulfonium, 4-[4-(benzoylphenylthio)]phenyldiphenylsulfonium, 5-(4-methoxyphenyl)thianthrenium, 5-phenylthianthrenium, 5-tolylthianthrenium, 5-(4-ethoxyphenyethianthrenium and 5-(2,4,6-trimethylphenyl)thianthrenium ions; diarylsulfonium ions such as diphenylphenacylsulfonium, diphenyl-4-nitrophenacylsulfonium, diphenylbenzylsulfonium and diphenylmethylsulfonium ions; monoarylsulfonium ions such as phenylmethylbenzylsulfonium, 4-hydroxyphenylmethylbenzylsulfonium, 4-methoxyphenylmethylbenzylsulfonium, 4-acetocarbonyloxyphenylmethylbenzylsulfonium, 2-naphthylmethylbenzylsulfonium, 2-naphthylmethyl(1- ethoxycarbonyl)ethylsulfonium, phenylmethylphenacylsulfonium, 4-hydroxyphenylmethylphenacylsulfonium, 4-methoxyphenylmethylphenacylsulfonium, 4-acetocarbonyloxyphenylmethylphenacylsulfonium, 2-naphthylmethylphenacylsulfonium, 2-naphthyloctadecylphenacylsulfonium and 9-anthracenylmethylphenacylsulfonium ions; and trialkylsulfonium ions such as dimethylphenacylsulfonium, phenacyltetrahydrothiophenium, dimethylbenzylsulfonium, benzyltetrahydrothiophenium and octadecylmethylphenacylsulfonium ions. These types of ions are disclosed in the following documents.

Documents related to the triarylsulfonium ions include U.S. Pat. Nos. 4,231,951, 4,256,828, JP 7-61964 A, JP 8-165290 A, JP 7-10914 A, JP 7-25922 A, JP 8-27208 A, JP 8-27209 A, JP 8-165290 A, JP 8-301991 A, JP 9-143212 A, JP 9-278813 A, JP 10-7680 A, JP 10-287643 A, JP 10-245378 A, JP 8-157510 A, JP 10-204083 A, JP 8-245566 A, JP 8-157451 A, JP 7-324069 A, JP 9-268205 A, JP 9-278935 A, JP 2001-288205 A, JP 11-80118 A, JP 10-182825 A, JP 10-330353 A, JP 10-152495 A, JP 5-239213 A, JP 7-333834 A, JP 9-12537 A, JP 8-325259 A, JP 8-160606 A and JP 2000-186071 A (U.S. Pat. No. 6,368,769); documents related to the diarylsulfonium ions include JP 7-300504 A, JP 64-45357 A and JP 64-29419 A; documents related to the monoarylsulfonium ions include JP 6-345726 A, JP 8-325225 A, JP 9-118663 A (U.S. Pat. No. 6,093,753), JP 2-196812 A, JP 2-1470 A, JP 2-196812 A, JP 3-237107 A, JP 3-17101 A, JP 6-228086 A, JP 10-152469 A, JP 7-300505 A, JP 2003-277353 A and JP 2003-277352 A; and documents related to the trialkylsulfonium ions include JP 4-308563 A, JP 5-140210 A, JP 5-140209 A, JP 5-230189 A, JP 6-271532 A, JP 58-37003 A, JP 2-178303 A, JP 10-338688 A, JP 9-328506 A, JP 11-228534 A, JP 8-27102 A, JP 7-333834 A, JP 5-222167 A, JP 11-21307 A, JP 11-35613 A and U.S. Pat. No. 6,031,014.

Examples of the phosphonium ion include tetraarylphosphonium ions such as tetraphenylphosphonium, tetra-p-tolylphosphonium, tetrakis(2-methoxyphenyl)phosphonium, tetrakis(3-methoxyphenyl)phosphonium and tetrakis(4-methoxyphenyl)phosphonium ions; triarylphosphonium ions such as triphenylbenzylphosphonium, triphenylphenacylphosphonium, triphenylmethylphosphonium and triphenylbutylphosphonium ions; and tetraalkylphosphonium ions such as triethylbenzylphosphonium, tributylbenzylphosphonium, tetraethylphosphonium, tetrabutylphosphonium, tetrahexylphosphonium, triethylphenacylphosphonium and tributylphenacylphosphonium ions. These types of ions are disclosed in JP 6-157624 A, JP 5-105692 A, JP 7-82283 A, and JP 9-202873 A and the like.

Examples of the carbenium ion include trialkylcarbenium ions such as trimethylcarbenium and triethylcarbeium ions, and triarylcarbenium ions such as triphenylcarbenium and tri-p-tolylcarbenium ions.

Bismuthonium ions are disclosed, for example, in JP 2008-214330 A.

Examples of the ammonium ion include tetraalkylammonium ions such as tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, trimethylisobutylammonium, trimethyl-t-butylammonium, trimethyl-n-hexylammonium, dimethyldi-n-propylammonium, dimethyldiisopropylammonium, dimethyl-n-propylisopropylammonium, methyltri-n-propylammonium and methyltriisopropylammonium ions; pyrrolidinium ions such as N,N-dimethylpyrrolidinium, N-ethyl-N-methylpyrrolidinium and N,N-diethylpyrrolidinium ions; imidazolinium ions such as N,N'-dimethylimidazolinium, N,N'-diethylimidazolinium, N-ethyl-N'-methylimidazolinium, 1,2,3-trimethylimidazolinium, 1,3,4-trimethylimidazolinium, 1,3-diethyl-2-methylimidazolinium, 1,3-diethyl-4-methylimidazolinium and 1,2,3,4-tetramethylimidazolinium ions; tetrahydropyrimidinium ions such as N,N'-dimethyltetrahydropyrimidinium, N,N'-diethyltetrahydropyrimidinium, N-ethyl-N'-methyltetrahydropyrimidinium and 1,2,3-trimethyltetrahydropyrimidinium ions; morpholinium ions such as N,N-dimethylmorpholinium, N-ethyl-N-methyhmorpholinium and N,N-diethylmorpholinium ions; piperidinium ions such as N,N-dimethylpiperidinium, N-ethyl-N-methylpiperidinium and N,N-diethylpiperidinium ions; pyridinium ions such as N-methylpyridinium, N-ethylpyridinium, N-n-propylpyridinium, N-isopropylpyridinium, N-n-butylpyridinium, N-benzylpyridinium and N-phenacylpyridinium ions; imidazolium ions such as N,N'-dimethylimidazolium, N-ethyl-N'-methylimidazolium, N,N'-diethylimidazolium, 1,2-diethyl-3-methylimidazolium, 1,3-diethyl-2-methylimidazolium and 1-methyl-3-n-propyl-2,4-dimethylimidazolium ions; quinolinium ions such as N-methylquinolinium, N-ethylquinolinium, N-n-propylquinolinium, N-isopropylquinolinium, N-n-butylquinolinium, N-benzylquinolinium and N-phenacylquinolinium ions; isoquinolinium ions such as N-methylisoquinolinium, N-ethylisoquinolinium, N-n-propylisoquinolinium, N-isopropylisoquinolinium, N-n-butylisoquinolinium, N-benzylisoquinolinium and N-phenacylisoquinolinium ions; thiazonium ions such as benzylbenzothiazonium and phenacylbenzothiazonium ions; and acridinium ions such as benzylacridinium and phenacylacridinium ions. Further, examples of the ammonium ion include anilinium ions, aminium ions, and imonium ions.

These types of ions are disclosed in U.S. Pat. No. 4,069,055, JP 2519480 B1, JP 5-222112 A, JP 5-222111 A, JP 5-262813 A, JP 5-255256 A, JP 7-109303 A, JP 10-101718 A, JP 2-268173 A, JP 9-328507 A, JP 5-132461 A, JP 9-221652 A, JP 7-43854 A, JP 7-43901 A, JP 5-262813 A, JP 4-327574 A, JP 2-43202 A, JP 60-203628 A, JP 57-209931 A, and JP 9-221652 A and the like.

Examples of the selenium ion include triarylselenium ions such as triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, tri-2-naphthylselenium, tris(4-hydroxyphenyl)selenium, 4-(phenylthio)phenyldiphenylselenium and 4-(p-tolylthio)phenyldi-p-tolylselenium ions; diarylselenium ions such as diphenylphenacylselenium, diphenylbenzylselenium and diphenylmethylselenium ions; monoarylselenium ions such as phenylmethylbenzylselenium, 4-hydroxyphenylmethylbenzylselenium, phenylmethylphenacylselenium, 4-hydroxyphenylmethylphenacylselenium and 4-methoxyphenylmethylphenacylselenium ions; and trialkylselenium ions such as dimethylphenacylselenium, phenacyltetrahydroselenophenium, dimethylbenzylselenium, benzyltetrahydroselenophenium and octadecylmethylphenacylselenium ions. These types of ions are disclosed in JP 50-151997 A, JP 50-151976 A, and JP 53-22597 A and the like.

Examples of the oxonium ion include trimethyloxonium, triethyloxonium, tripropyloxonium, tributyloxonium, trihexyloxonium, triphenyloxonium, pyrylium, chromenilium and xanthylium ions.

Tropylium ions are disclosed, for example, in J. Polym. Sci. Part A; Polym. Chem., 42, 2166 (2004).

From the viewpoint of enhancing the hole transport properties, the anion (3A), (4A) or (5A) is preferable, and the anion (3A) or (4A) is more preferable. Similarly, from the viewpoint of enhancing the hole transport properties, the cation (1B) or (3B) is preferable. The ionic compound is preferably a compound having at least one anion selected from among these anions, and at least one cation selected from among these cations.

More specifically, compounds containing at least one anion selected from among fluoroalkane sulfonyl methide ions (for example, (3A)) and borate ions (for example, (4A)), and at least one cation selected from among ammonium ions and iodonium ions are preferred.

From the viewpoint of enabling the treatment liquid to be used with various coating processes, the amount of the ionic compound, relative to the total mass of the treatment liquid, is preferably at least 0.01% by mass, more preferably at least 0.1% by mass, and still more preferably 0.3% by mass or greater. The above range is also preferred in terms of enabling the hole transport properties to be enhanced with a single treatment. Further, in order to enable the treatment liquid to be used with various coating processes, the amount of the ionic compound, relative to the total mass of the treatment liquid, is preferably not more than 50% by mass, more preferably 20% by mass or less, and still more preferably 10% by mass or less. This range is also preferred in terms of preventing short-circuits within the various layers due to precipitation of crystals of the ionic compound. Specifically, the amount of the ionic compound, relative to the total mass of the treatment liquid, is preferably from 0.01 to 50% by mass, more preferably from 0.1 to 20% by mass, and still more preferably from 0.3 to 10% by mass.

[Solvent]

The solvent is preferably a solvent capable of dissolving or dispersing the ionic compound, and is more preferably a solvent capable of dissolving the ionic compound. The treatment liquid may contain only a single solvent, or may contain two or more solvents.

Water and organic solvents and the like can be used as the solvent. Examples of the organic solvents include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amides such as N,N-dimethylformamide and N,N-dimethylacetamide; as well as dimethyl sulfoxide, tetrahydrofuran, acetone, chloroform and methylene chloride. From the viewpoint of the solubility of the ionic compound, the use of an aromatic hydrocarbon, aliphatic ester, aromatic ester, aliphatic ether or aromatic ether is preferable. If productivity is also taken into consideration, then the use of a solvent having a boiling point at one atmosphere of 50 to 300° C. is preferred.

[Compound Having Polymerizable Substituent]

The treatment liquid may also include a compound having a polymerizable substituent. Use of a compound having a polymerizable substituent is desirable from the viewpoint of improving the lifespan properties of the organic electronic element. The treatment liquid may contain only a single compound having a polymerizable substituent, or may contain two or more such compounds.

The polymerizable substituent is a group that can form bonds through application of heat and/or light. The compound having a polymerizable substituent is preferably a compound having at least one group selected from the group consisting of an oxetanyl group (oxetane group), epoxy group (oxiranyl group), vinyl group, vinyl ether group (vinyloxy group), acrylate group (acryloyloxy group) and methacrylate group (methacryloyloxy group). The polymerizable substituent is preferably an oxetanyl group, epoxy group or vinyl ether group, and is more preferably an oxetanyl group or an epoxy group. From the viewpoint of improving the lifespan properties of the organic electronic element, these compounds having a polymerizable substituent may also include an oxygen atom derived from an ether linkage or a hydroxyl group or the like, in a portion of the molecule outside the aforementioned polymerizable substituent.

The compound having a polymerizable substituent has at least one polymerizable substituent per molecule. The compound may have two or more of the same or different polymerizable substituents within each molecule. Further, from the viewpoint of the stability of the treatment liquid, the total number of polymerizable substituents is preferably not more than 100 per molecule.

The compound having a polymerizable substituent may be a low-molecular weight compound, or a polymer or oligomer of a monomer.

In one embodiment, the compound having a polymerizable substituent may include a structure containing a conjugated system in addition to the structure of the polymerizable substituent. Further, in another embodiment, the compound having a polymerizable substituent may not have a structure containing a conjugated system in addition to the structure included in the polymerizable substituent. Examples of the conjugated system include conjugated structures that can be included within a layer having hole transport properties, and conjugated structures which exhibit hole transport properties, and specific examples include structures described below as units having hole transport properties, aromatic hydrocarbon structures, and aromatic compound structures having a hetero atom. From the viewpoint of enabling enhancement of the properties of the organic electronic element using a treatment liquid that can be prepared simply and cheaply, and from the viewpoint of reducing the absorption of light emitted from the light-emitting layer toward the anode side, thereby improving the light emission efficiency of the organic EL element, the compound having a polymerizable substituent preferably does not have a structure containing a conjugated system except for conjugated systems included in the polymerizable substituent.

Examples of the compound having a polymerizable substituent are listed below.

A "compound having an oxetanyl group" refers to an oxetane compound having at least one oxetanyl group within the molecule. Conventional compounds having an oxetanyl group can be used without any particular restrictions.

Specific examples of the compound having an oxetanyl group include 3-ethyl-3-(2-ethylhexyloxymethyl)oxetane, 3-ethyl-3-(dodecyloxymethyl)oxetane, 3-ethyl-3-(octadecyloxymethyl)oxetane, 3-ethyl-3-(phenoxymethyl)oxetane, 3-ethyl-3-hydroxymethyloxetane, 1,4-bis{[3-ethyl-3-oxetanyl)methoxy]methyl}benzene, bis[(3-ethyl-3-oxetanyl)methyl]ether, bis[2-(3-oxetanyl)butyl]ether, 1,4-bis[(3-ethyloxetan-3-yl)methoxy]benzene, 1,3-bis[(3-ethyloxetan-3- yl)methoxy]benzene, 1,2-bis[(3-ethyloxetan-3-yl)methoxy] benzene, 4,4'-bis[(3-ethyloxetan-3-yl)methoxy]biphenyl, 2,2'-bis[(3-ethyl-3-oxetanyl)methoxy]biphenyl, 3,3',5,5'-tetramethyl[4,4'-bis(3-ethyloxetan-3-yl)methoxy]biphenyl, 2,7-bis[(3-ethyloxetan-3-yl)methoxy]naphthalene, 1,6-bis[(3-ethyloxetan-3-yl)methoxy]-2,2,3,3,4,4,5,5-octafluorohexane, 3(4),8(9)-bis[(1-ethyl-3-oxetanypmethoxymethyl]-tricyclo[5.2.1.0$^{2.6}$]decane, 1,2-bis[2-{(1-ethyl-3-oxetanyl)methoxy}ethylthio]ethane, 4,4'-bis[(1-ethyl-3-oxetanyl)methyl]thiodibenzene thioether, 2,3-bis[(3-ethyloxetan-3-yl)methoxymethyl]norbornane, 2-ethyl-2-[(3-ethyloxetan-3-yl)methoxymethyl]-1,3-O-bis[(1-ethyl-3-oxetanyl) methyl]-propane-1,3-diol, 2,2-dimethyl-1,3-O-bis[(3-ethyloxetan-3-yl)methyl]-propane-1,3-diol, 2-butyl-2-ethyl-1,3-O-bis[(3-ethyloxetan-3-yl)methyl]-propane-1,3-diol, 1,4-O-bis[(3-ethyloxetan-3-yl)methyl]-butane-1,4-diol, 2,4,6-O-tris[(3-ethyloxetan-3-yl)methyl]cyanuric acid, and ether compounds obtained by reacting bisphenol A and 3-ethyl-3-chloromethyloxetane (hereafter abbreviated as OXC), ether compounds obtained by reacting bisphenol F and OXC, ether compounds obtained by reacting phenol novolac and OXC, ether compounds obtained by reacting cresol novolac and OXC, and oxetanyl silsesquioxanes. These compounds can be obtained, for example, from Toagosei Co., Ltd. and Ube Industries, Ltd. and the like.

A "compound having an epoxy group" refers to an epoxy compound having at least one epoxy group within the molecule. Conventional compounds having an epoxy group can be used as the epoxy compound without any particular restrictions.

Examples of the compound having an epoxy group include bisphenol-type epoxy compounds derived from epichlorohydrin and bisphenol A or bisphenol F or the like; novolac-type epoxy compounds such as cresol novolac epoxy compounds and phenol novolac epoxy compounds; glycidyl ether-type epoxy compounds such as monoglycidyl ethers, diglycidyl ethers and trifunctional or higher polyglycidyl ethers; glycidyl ester-type epoxy compounds such as monoglycidyl esters, diglycidyl esters and trifunctional or higher polyglycidyl esters; glycidyl amine-type epoxy compounds such as monoglycidyl amines, diglycidyl amines and trifunctional or higher polyglycidyl amines; copolymers of glycidyl (meth)acrylates and copolymerizable vinyl monomers; alicyclic epoxy compounds; aromatic epoxy compounds; and triglycidyl isocyanurate. These compounds can be obtained, for example, from Nagase ChemteX Corporation, Mitsubishi Chemical Corporation, Nippon Steel & Sumikin Chemical Co., Ltd., DIC Corporation, New Japan Chemical Co., Ltd., and Daicel Corporation and the like.

Examples of the bisphenol-type epoxy compounds include bisphenol A epoxy resins, bisphenol F epoxy resins, bisphenol S epoxy resins and bisphenol AD epoxy resins.

Examples of the novolac-type epoxy compounds include cresol novolac epoxy resins, phenol novolac epoxy resins, naphthol novolac epoxy resins and bisphenol A novolac epoxy resins.

The glycidyl ether-type epoxy compounds are compounds having a glycidyl ether group within the molecule. Specific examples of the glycidyl ether-type epoxy compounds include methyl glycidyl ether, ethyl glycidyl ether, propyl glycidyl ether, butyl glycidyl ether, pentyl glycidyl ether, hexyl glycidyl ether, 2-ethylhexyl glycidyl ether, 2-methyloctyl glycidyl ether, phenyl glycidyl ether, cyclohexane glycidyl ether, p-t-butylphenyl glycidyl ether, o-cresyl glycidyl ether, biphenyl glycidyl ether, pentaerythritol polyglycidyl ether, diglycerol polyglycidyl ether, glycerol polyglycidyl ether, trimethylolpropane polyglycidyl ether, neopentyl glycol diglycidyl ether, 1,6-hexanediol polyglycidyl ether, polyethylene glycol diglycidyl ether, polypropylene glycol diglycidyl ether, 1,4-bis(glycidyloxymethyl) benzene and 1,4-bis(glycidyloxymethyl)cyclohexane.

The glycidyl amine-type epoxy compounds are compounds having a glycidylamino group within the molecule. Specific examples of the glycidyl amine-type epoxy compounds include N-(oxiranylmethyl)-N,N-dimethylamine, N-(oxiranylmethyl)-N,N-diethylamine, N-ethyl-N-(oxiranylmethyl)aniline, N-methyl-N-(oxiranylmethyl)aniline, N,N-bis(oxiranylmethyl)aniline, 1,3-bis(diglycidylaminomethyl)cyclohexane, and tetraglycidyldiaminodiphenylmethane.

The glycidyl ester-type epoxy compounds are compounds having a glycidyl ester group within the molecule. Specific examples of the glycidyl ether-type epoxy compounds include glycidyl acetate, glycidyl propionate, glycidyl butyrate, glycidyl valerate, glycidyl benzoate, diglycidyl phthalate, diglycidyl hexahydrophthalate and diglycidyl tetrahydrophthalate.

The alicyclic epoxy compounds are compounds having an epoxy group formed from one oxygen atom and two of the carbon atoms that constitute a cyclic hydrocarbon structure within the molecule. Examples of the alicyclic epoxy compounds include cyclohexene oxide-containing compounds and cyclopentene oxide-containing compounds obtained by oxidizing cyclohexene or cyclopentene ring-containing compounds. More specific examples include 2-(3,4-epoxycyclohexyl)-5,5-spiro-(3,4-epoxycyclohexane)-meta-dioxane, 3,4-epoxy-1-methylcyclohexyl-3,4-epoxy-1-methylhexane carboxylate, 3,4-epoxy-3-methylcyclohexylmethyl-3,4-epoxy-3-methylcyclohexane carboxylate, 3,4-epoxy-5-methylcyclohexylmethyl-3,4-epoxy-5-methylcyclohexane carboxylate, 3,4-epoxy-6-methylcyclohexyl carboxylate, 3,4-epoxycyclohexylmethyl-3,4-epoxycyclohexane carboxylate, 6-methyl-3,4-epoxycyclohexylmethyl-6-methyl-3,4-epoxycyclohexane carboxylate, ethylenebis(3,4-epoxycyclohexane carboxylate), dicyclopentadiene diepoxide, bis (3,4-epoxycyclohexylmethyl) adipate and methylenebis(3, 4-epoxycyclohexane).

A "compound having a vinyl group" is a compound having at least one vinyl group in the molecule. However, this definition excludes "compounds having a vinyl ether group", "compounds having an acrylate group" and "compounds having a methacrylate group". Examples of the compound having a vinyl group include butadiene, 1,3-pentadiene, 1-buten-3-ol, 1-penten-3-ol, 1-hexen-3-ol, 1-vinylcyclohexane, styrene and divinylbenzene.

A "compound having a vinyl ether group" is a compound having at least one vinyl ether group in the molecule. Examples of the compound having a vinyl ether group include divinyl ether, methyl vinyl ether, ethyl vinyl ether, 1,4-butanediol divinyl ether, cyclohexanedimethanol divinyl ether, diethylene glycol divinyl ether, triethylene glycol divinyl ether and 1,4-bis(vinyloxymethyl)cyclohexane.

A "compound having an acrylate group" is a compound having at least one acrylate group in the molecule, and a "compound having a methacrylate group" is a compound having at least one methacrylate group in the molecule. Examples of compounds having a (meth)acrylate group (wherein the expression "compounds having a (meth)acrylate group" includes both compounds having an acrylate group and compounds having a methacrylate group) include methyl (meth)acrylate, ethyl (meth)acrylate, n-propyl (meth)acrylate, isopropyl (meth)acrylate, n-butyl (meth) acrylate, isobutyl (meth)acrylate, cyclohexyl (meth)acrylate, benzyl (meth)acrylate, carbitol (meth)acrylate, methoxy-ethyl (meth)acrylate, ethoxyethyl (meth)acrylate, butoxyethyl (meth)acrylate, hydroxyethyl (meth)acrylate, hydroxypropyl (meth)acrylate, butylene glycol (meth)acrylate, N,N-dimethylaminoethyl (meth)acrylate, N,N-diethylaminoethyl (meth)acrylate, tetrahydrofurfuryl (meth)acrylate, pentaerythritol mono(meth)acrylate, trimethylolpropane mono(meth)acrylate, 1,3-propylene glycol di(meth)acrylate, 1,4-butylene glycol di(meth)acrylate, 1,6-hexane glycol di(meth)acrylate, neopentyl glycol di(meth)acrylate, dipropylene glycol di(meth)acrylate, 2,2-bis-(4-(meth)acryloxy-diethoxyphenyl)propane, 2,2-bis-(4-(meth)acryloxy-propoxyphenyl)propane, trimethylolpropane di(meth)acrylate, pentaerythritol di(meth)acrylate, trimethylolpropane tri(meth)acrylate, pentaerythritol tri(meth)acrylate and tetramethylolmethane tetra(meth)acrylate.

The compound having a polymerizable substituent may have one or more of each of two or more different types of polymerizable substituent within the same molecule. Examples of compounds having two or more types of polymerizable substituents include 3-(vinyloxymethyl)oxetane, 3-oxetanyl (meth)acrylate, (3-methyl-3-oxetanyl) methyl (meth)acrylate, (3-ethyl-3-oxetanyl)methyl (meth) acrylate, 2-(vinyloxymethyl)oxirane, 2-oxiranylmethyl (meth)acrylate, (2-methyl-2-oxiranyl)methyl (meth)acrylate and 2-(ethenyloxy)ethyl (meth)acrylate. These compounds can be obtained, for example, from Osaka Organic Chemical Industry Ltd.

If the treatment liquid contains an ionic compound, a compound having a polymerizable substituent and a solvent, then from the viewpoint of enabling the treatment liquid to be used with various coating processes, the combined amount of the ionic compound and the compound having a polymerizable substituent, relative to the total mass of the treatment liquid, is preferably at least 0.2% by mass, more preferably at least 0.3% by mass, and still more preferably 0.5% by mass or greater. Further, in order to enable the treatment liquid to be used with various coating processes, the combined amount of the ionic compound and the compound having a polymerizable substituent, relative to the total mass of the treatment liquid, is preferably not more than 50% by mass, more preferably 30% by mass or less, and still more preferably 20% by mass or less. Specifically, the combined amount of the ionic compound and the compound having a polymerizable substituent, relative to the total mass of the treatment liquid, is preferably from 0.2 to 50% by mass, more preferably from 0.3 to 30% by mass, and still more preferably from 0.5 to 20% by mass. The solvent is preferably a solvent, selected from among the solvents mentioned above, that is capable of dissolving the ionic compound and the compound having a polymerizable substituent.

From the viewpoint of better enhancing the hole transport properties, the mass ratio between the ionic compound and the compound having a polymerizable substituent is set so that, relative to 1 part by mass of the ionic compound, the mass of the compound having a polymerizable substituent is preferably not more than 1,000 parts, more preferably not more than 100 parts, and still more preferably 10 parts or less. Similarly, from the viewpoint of better enhancing the hole transport properties, the mass of the ionic compound relative to 1 part by mass of the compound having a polymerizable substituent is preferably not more than 1,000 parts, more preferably not more than 100 parts, and still more preferably 10 parts or less. More specifically, the mass ratio between the ionic compound and the compound having a polymerizable substituent is preferably within a range from 1:1,000 to 1,000:1, more preferably from 1:100 to 100:1, and still more preferably from 1:10 to 10:1.

[Other Optional Components]

The treatment liquid contains at least the ionic compound and the solvent, and in some cases also contains the compound having a polymerizable substituent. In one embodiment, the treatment liquid may contain a compound having hole transport properties. In another embodiment, the treatment liquid may not contain a compound having hole transport properties. In those cases when the treatment liquid contains a compound having hole transport properties, from the viewpoint of enhancing the properties of the organic electronic element, the mass ratio between the ionic compound and the compound having hole transport properties is set so that, relative to 1 part by mass of the ionic compound, the mass of the compound having hole transport properties is preferably not more than 10 parts, more preferably not more than 1 part, still more preferably not more than 0.1 parts, and particularly preferably 0.01 parts or less. From the viewpoint of enabling enhancement of the properties of the organic electronic element using a treatment liquid that can be prepared simply and cheaply, and from the viewpoint of reducing the absorption of light emitted from the light-emitting layer, thereby improving the light emission efficiency of the organic EL element, the treatment liquid preferably does not contain a compound having hole transport properties. Examples of the compound having hole transport properties include the types of hole-transporting compounds that can be used in the layer having hole transport properties described below.

In one embodiment, the treatment liquid may also contain one or more optional components such as dispersants, surfactants or oxidizing agents. However, in another embodiment, the treatment liquid may not contain optional components such as dispersants, surfactants or oxidizing agents. When the treatment liquid contains these types of optional components, from the viewpoint of achieving a combination of good dispersion stability and superior hole transport properties, the mass ratio between the ionic compound and the optional components is set so that, relative to 1 part by mass of the ionic compound, the mass of the optional components is preferably not more than 100 parts, more preferably not more than 10 parts, and still more preferably 1 part or less. From the viewpoint of enhancing the properties of the organic electronic element using a treatment liquid that can be prepared simply and cheaply, and from the viewpoint of maximizing the hole transport properties, the treatment liquid preferably may not contain any optional components.

[Usage Methods]

The treatment liquid is used for adhering the ionic compound to a surface on which a layer having hole transport properties is to be formed, a surface of a layer having hole transport properties, or both these types of surfaces. The treatment liquid is, for example, to be applied to a surface on which a layer having hole transport properties is to be formed. Conventional methods can be employed as the application method, and examples include spin coating methods, casting methods, dipping methods, and printing methods such as relief printing, intaglio printing, offset printing, lithographic printing, relief reversal offset printing, screen printing, gravure printing and inkjet printing. The application process is typically conducted in a temperature range from −20 to +300° C., preferably from 10 to 100° C., and particularly preferably from 15 to 50° C. Following application, the obtained coating film may be dried using a hotplate or an oven to remove the solvent. The drying temperature is typically from +30 to +300° C., preferably from 60 to 250° C., and particularly preferably from 80 to 220° C. The drying time is typically from 10 seconds to 2 hours, preferably from 1 minute to 1 hour, and particularly preferably from 1 to 10 minutes.

In those cases when the treatment liquid contains a compound having a polymerizable substituent, it is preferable that following application of the treatment liquid, the applied coating film is subjected to irradiation with light and/or a heat treatment or the like to cause the polymerizable substituent to react. For the light irradiation, a low-pressure mercury lamp, medium-pressure mercury lamp, high-pressure mercury lamp, ultra-high-pressure mercury lamp, metal halide lamp, xenon lamp, fluorescent lamp, light-emitting diode, or sunlight or the like may be used as the light source, whereas the heating may be performed on a hotplate or in an oven. The heating temperature is typically from +60 to +300° C., preferably from 80 to 250° C., and particularly preferably from 100 to 220° C. The heating time is typically from 10 seconds to 2 hours, preferably from 1 minute to 1 hour, and particularly preferably from 1 to 10 minutes.

Following the drying, light irradiation or heat treatment, the coating film may be washed to remove any unneeded components. The washing must be performed such that the effect of enhancing the hole transport properties is retained. The washing treatment may be performed by methods such as rinsing the surface to which the treatment liquid has been applied with water or an organic solvent, or dipping the surface in water or an organic solvent.

Figure 2:
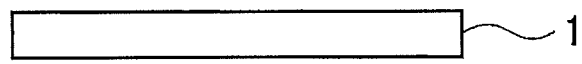
Figure 2:
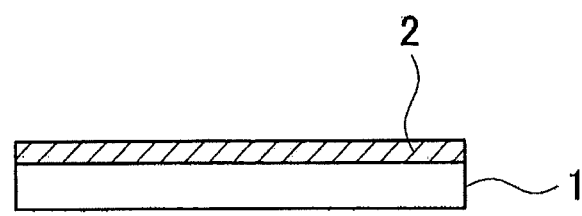
Figure 2:
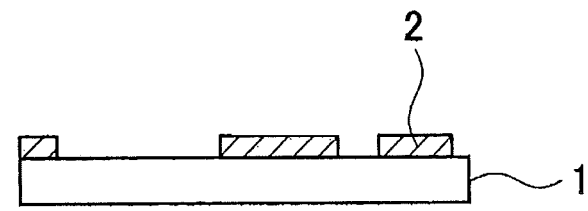
Figure 2:
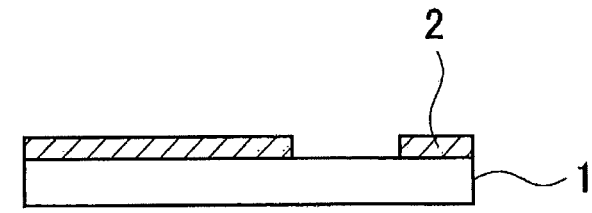

The coating film obtained by applying the treatment liquid may be a continuous film or a non-continuous film. Further, the thickness of the film may be uniform or non-uniform. FIG. 1 and FIG. 2 illustrate examples of coating films. In FIG. 1 and FIG. 2, the surface of an anode is the surface on which the layer having hole transport properties is to be formed, and the treatment liquid is applied to the surface of the anode. FIG. 1(a) to FIG. 1(c2) are schematic plan views illustrating: (a) the anode, (b) a continuous coating film, and (c1) and (c2) coating films having non-continuous portions. FIG. 2(a) to FIG. 2(c2) are schematic cross-sectional views illustrating: (a) the anode, (b) a continuous coating film, and (c1) and (c2) coating films having non-continuous portions. The coating film illustrated in FIG. 1(c2) and FIG. 2(c2) is an island-type coating film.

From the viewpoint of enhancing the hole transport properties, the thickness of the coating film following the drying, light irradiation, heating and/or washing treatment is preferably not more than 100 nm, more preferably not more than 30 nm, and still more preferably 10 nm or less.

Regardless of whether the coating film is a continuous coating film or a coating film having non-continuous portions, the thickness of the coating film refers to the average value of the thickness at 10 random points selected from portions where the treatment liquid has been applied. The thickness of the coating film can be measured, for example, by ellipsometry or using a stylus-type thickness meter. The use of a stylus-type thickness meter is preferable.

[Layer Having Hole Transport Properties]

Next is a description of the layer having hole transport properties. The expression "having hole transport properties" means "having the capability of transporting holes". The layer having hole transport properties can be formed using, for example, a polymer or oligomer (namely, a macromolecular compound that is a polymeric form of a monomer) having a unit with hole transport properties, or a low-molecular weight compound having a structure with hole transport properties (in the following description, a polymer or oligomer having a unit with hole transport properties is also referred to as a "polymer or oligomer having hole transport properties", a low-molecular weight compound having hole transport properties is also referred to as a "hole-transporting low-molecular weight compound", and a hole-transporting polymer or oligomer and a hole-transporting low-molecular weight compound may be referred to jointly as a "hole-transporting compound"). From the viewpoint of ensuring suitability with wet processes, a hole-transporting polymer or oligomer can be used particularly favorably. Further, from the viewpoint of enabling high-purity compounds to be obtained with relative ease using a purification technique such as sublimation purification, a hole-transporting low-molecular weight compound can be used particularly favorably.

[Hole-Transporting Polymer or Oligomer]

The unit having hole transport properties may be any unit with the capability of transporting holes, and examples include units containing an aromatic amine structure, units containing a carbazole structure, and units containing a thiophene structure. Units containing an aromatic amine structure and/or units containing a carbazole structure are preferable. The hole-transporting polymer or oligomer may contain two or more types of these units. Further, the hole-transporting polymer or oligomer may have a branched structure within the molecule, and may have three or more terminals. A branched structure describes a structure in which the hole-transporting polymer or oligomer has a branched portion, with the units that constitute the chain of the polymer or oligomer extending in three or more directions from the branched portion. The hole-transporting polymer or oligomer may have a unit that becomes the branch origin as the branch portion. A hole-transporting polymer or oligomer having a branched structure and having three or more terminals is composed of a main chain and one or more side chains.

Examples of units having hole transport properties are shown below in formulas (1a) to (93a). The units represented by formulas (85a) to (93a) are units that can become a branch origin.

<Formulas (1a) to (84a)>

[Chemical Formula 7]

(1a)

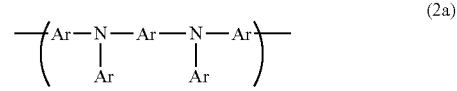
(2a)

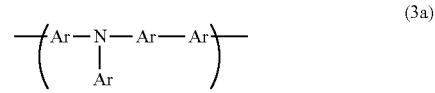
(3a)

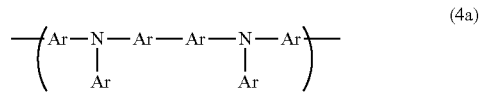
(4a)

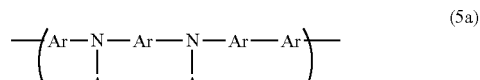
(5a)

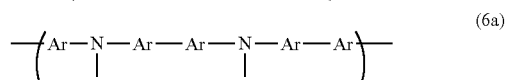
(6a)

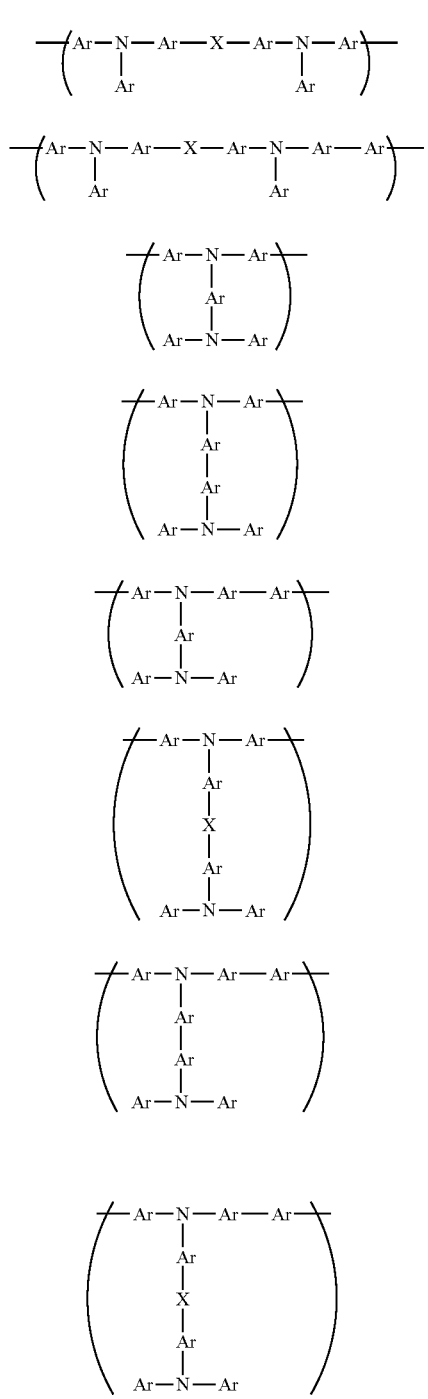
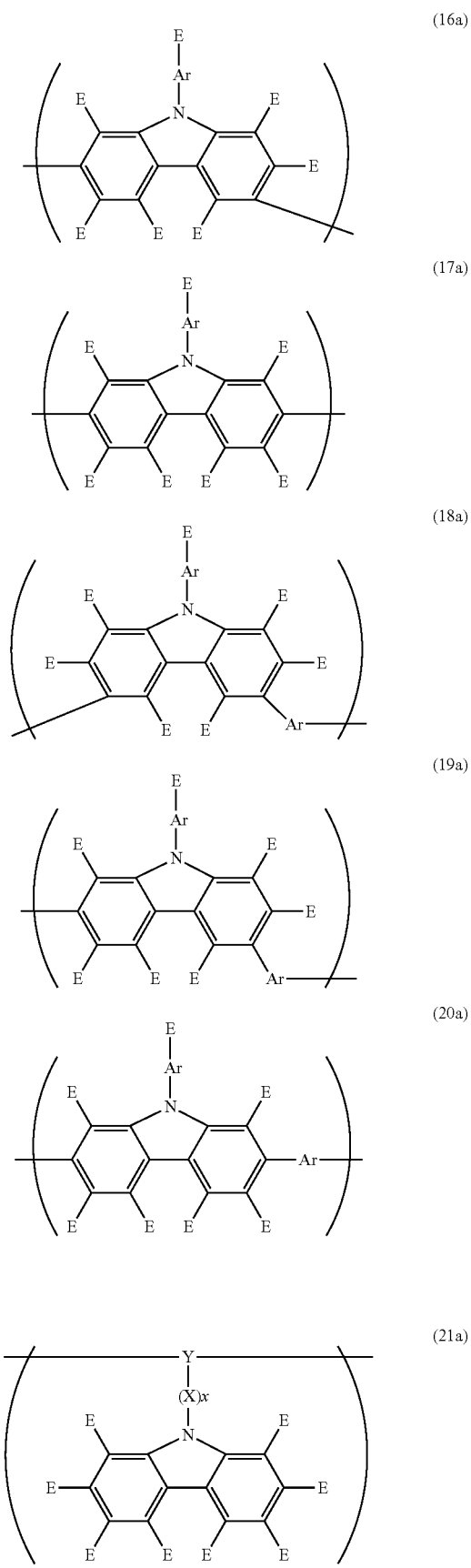
[Chemical Formula 8]

-continued
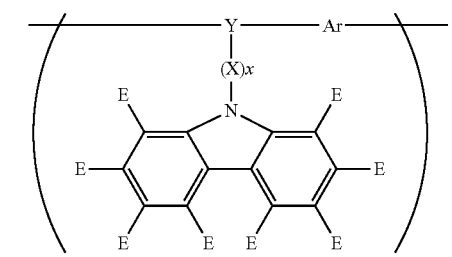
(22a)
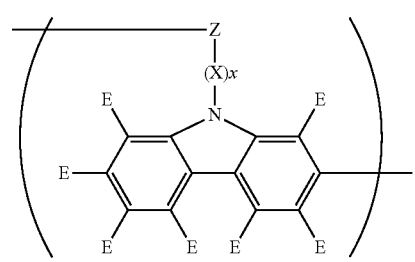
(23a)
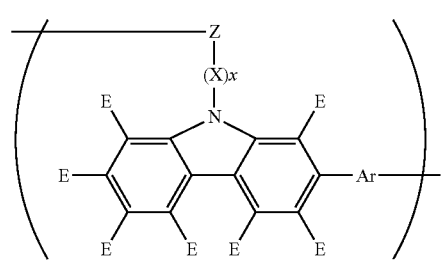
(24a)
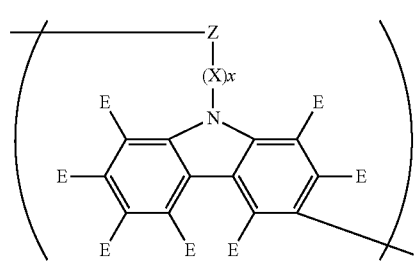
(25a)
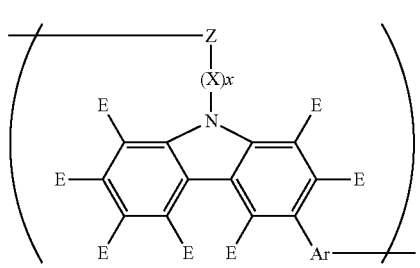
(26a)
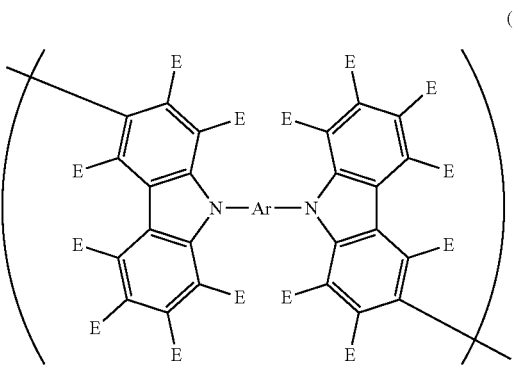
(27a)
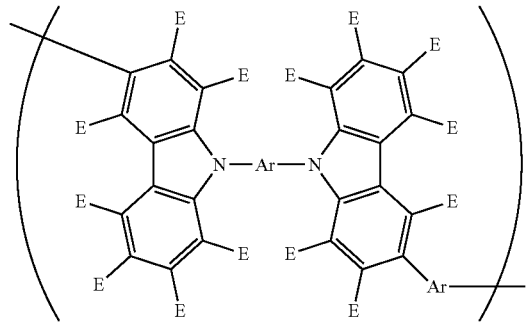
(28a)
[Chemical Formula 9]
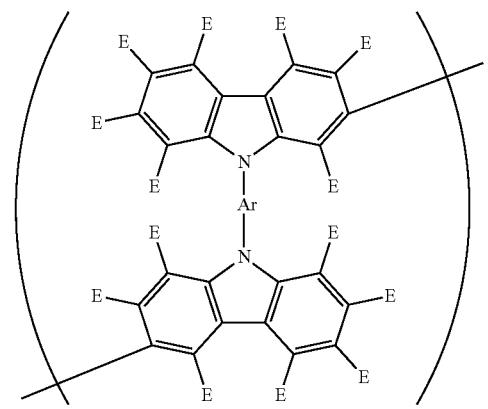
(29a)
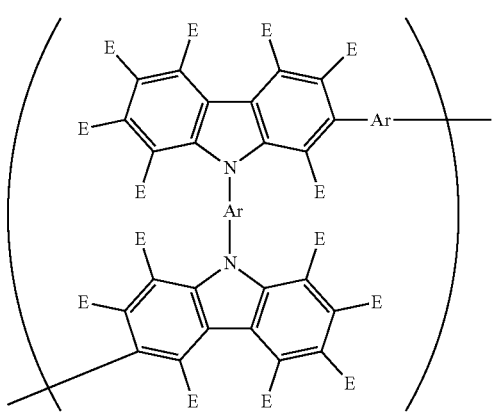
(30a)

[Chemical Formula 10]
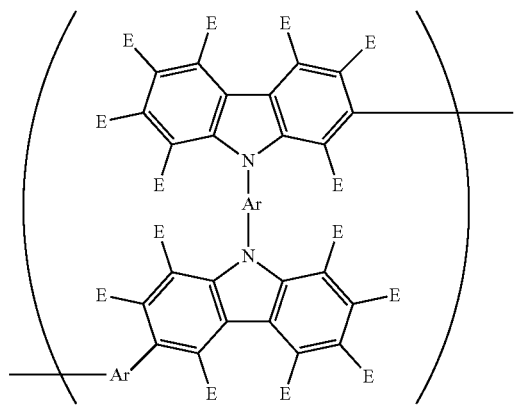
(31a)
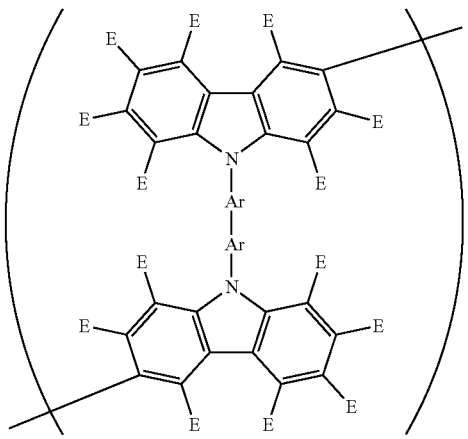
(34a)
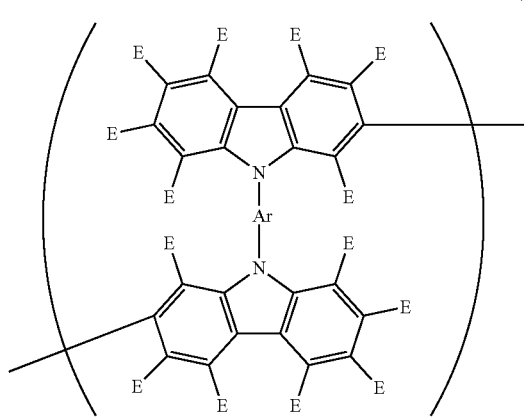
(32a)
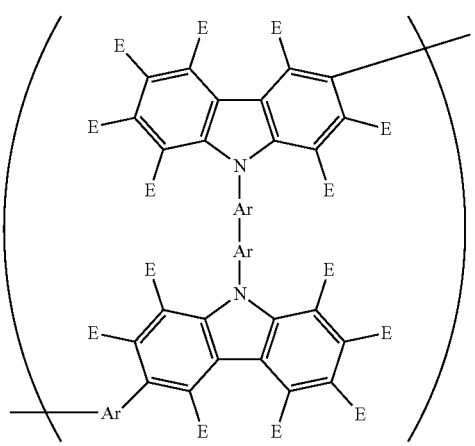
(35a)
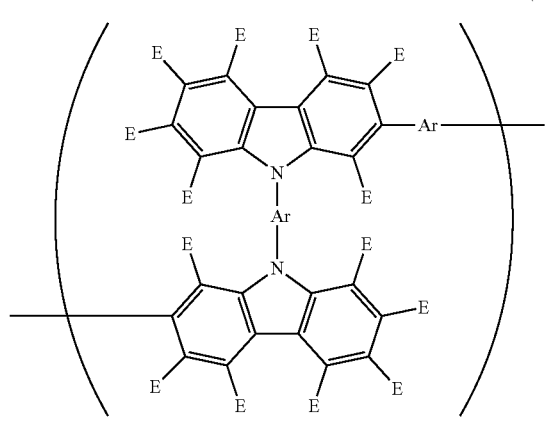
(33a)
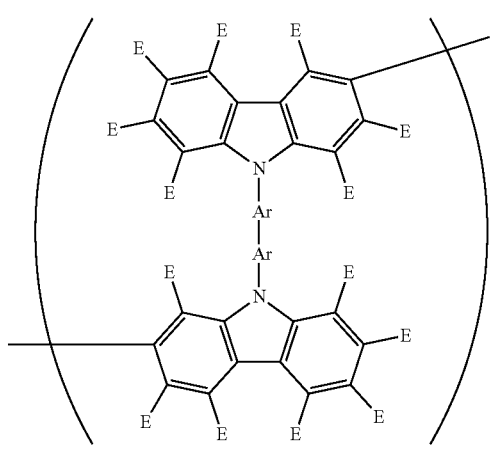
(36a)

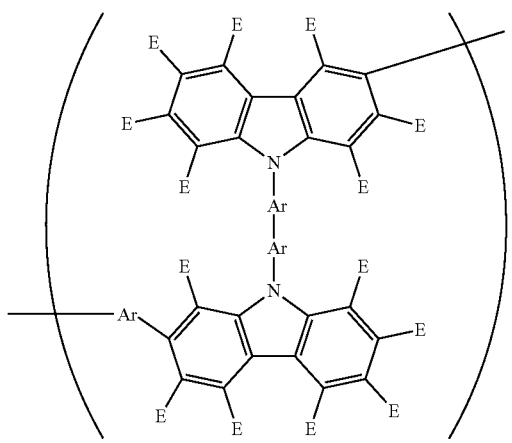
(37a)
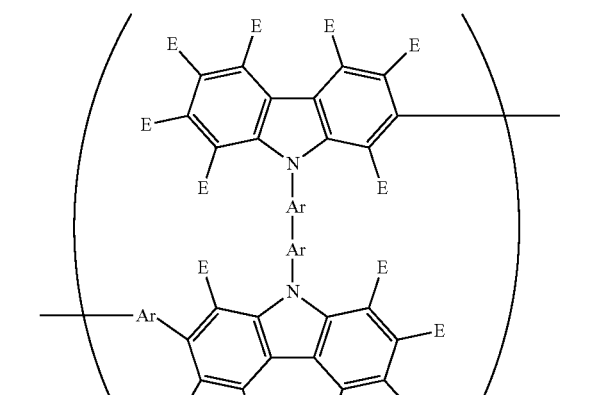
(40a)
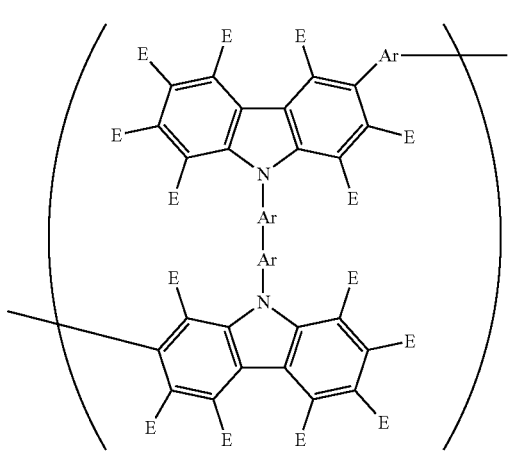
(38a)
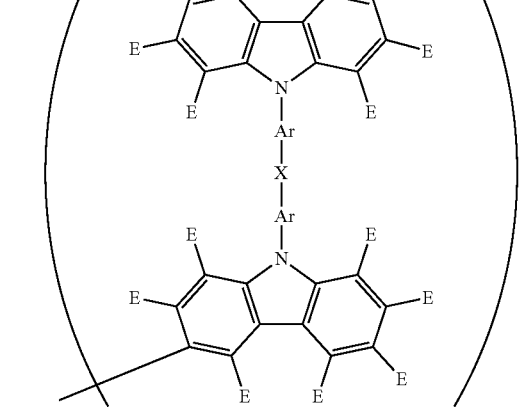
(41a)
[Chemical Formula 11]
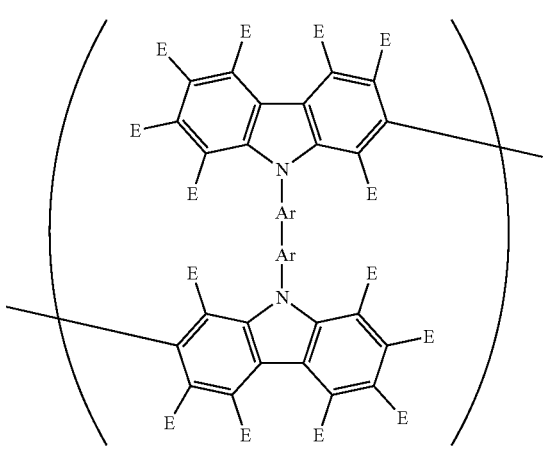
(39a)
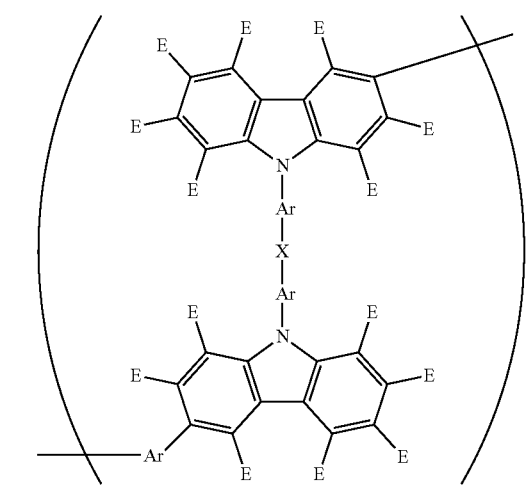
(42a)

-continued
(43a)
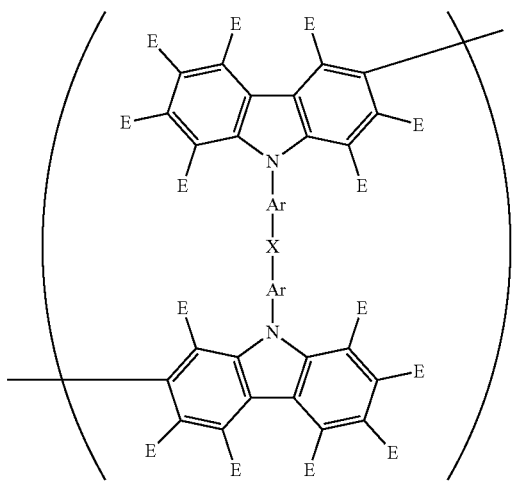
(44a)
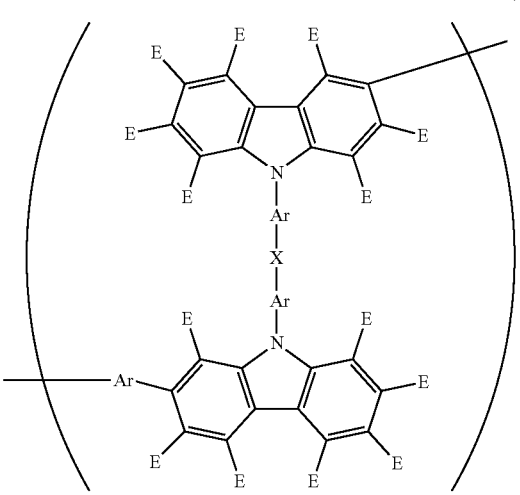
[Chemical Formula 12]
(45a)
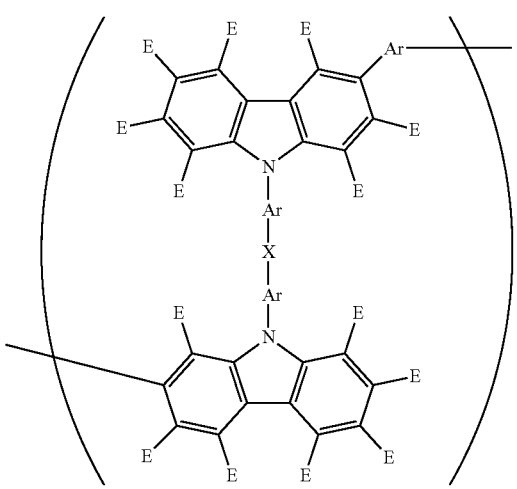
-continued
(46a)
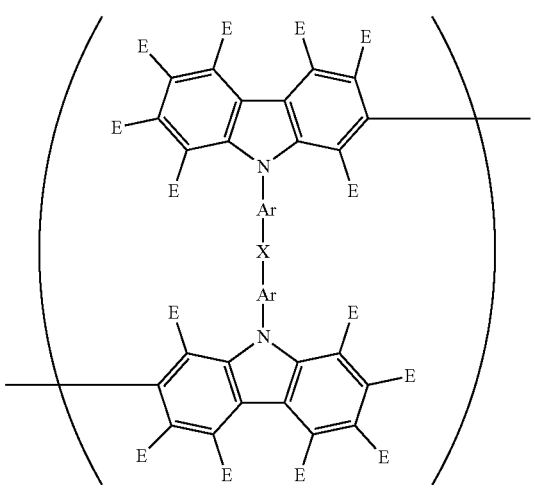
(47a)
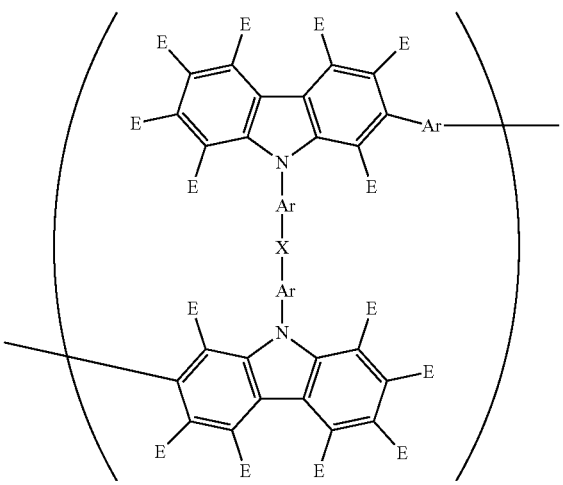
(48a)
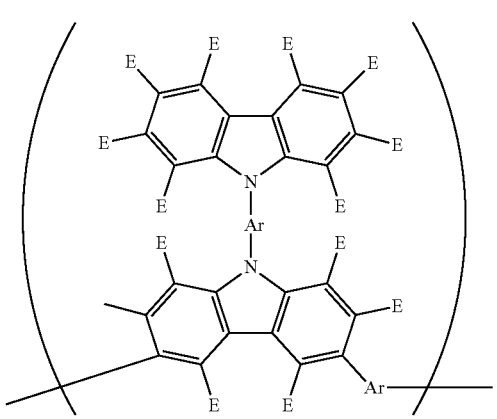

(49a) 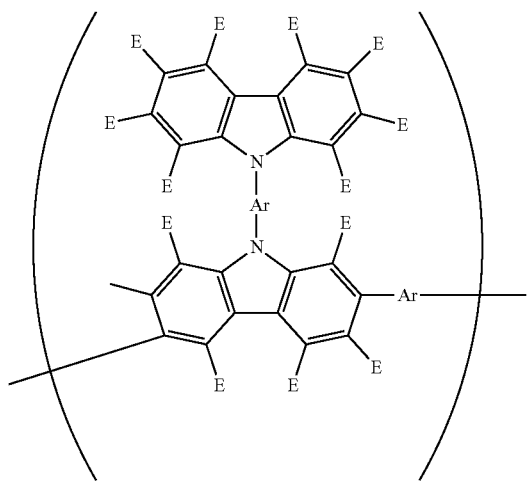
(52a) 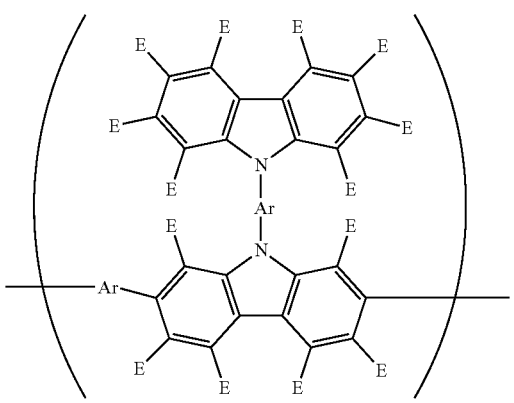
[Chemical Formula 13]
(50a) 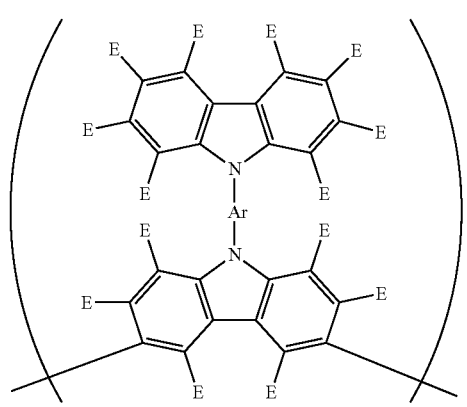
(53a) 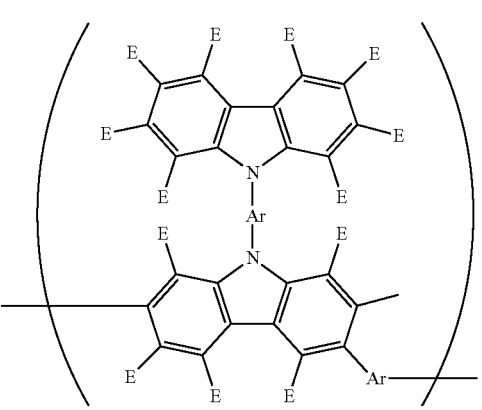
(51a) 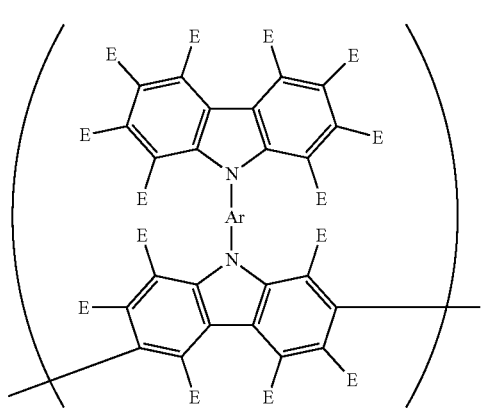
(54a) 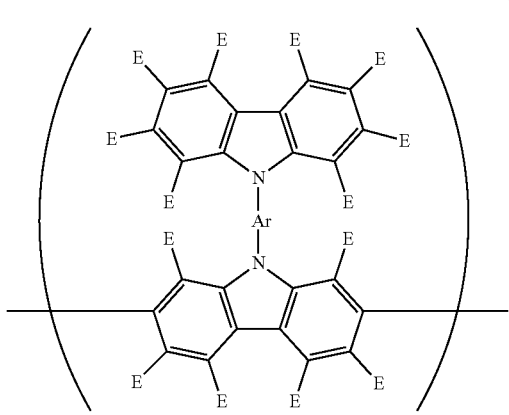

[Chemical Formula 14]
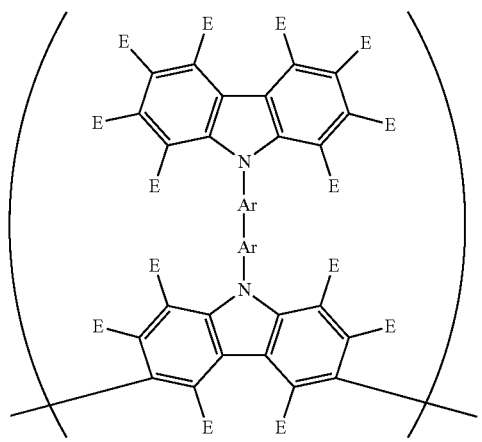 (55a)
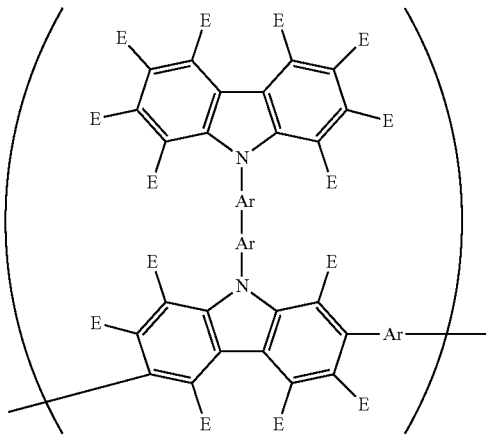 (58a)
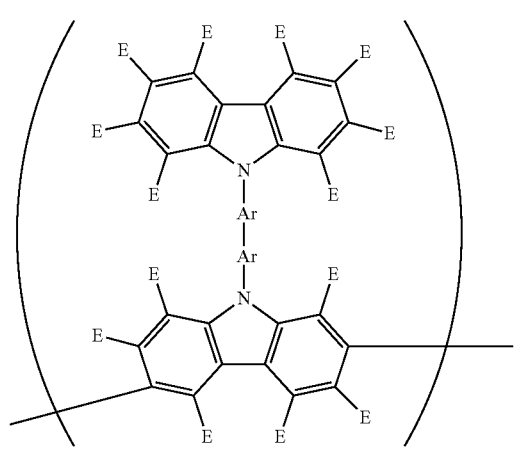 (56a)
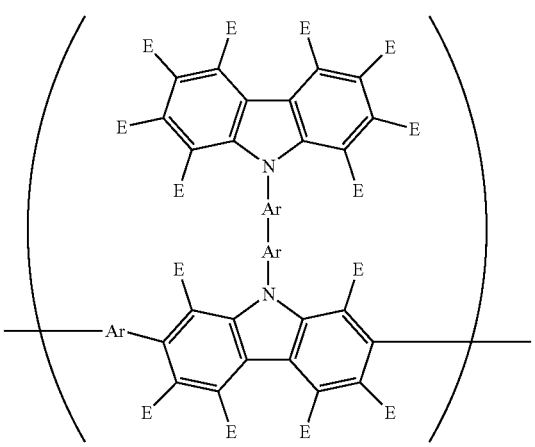 (59a)
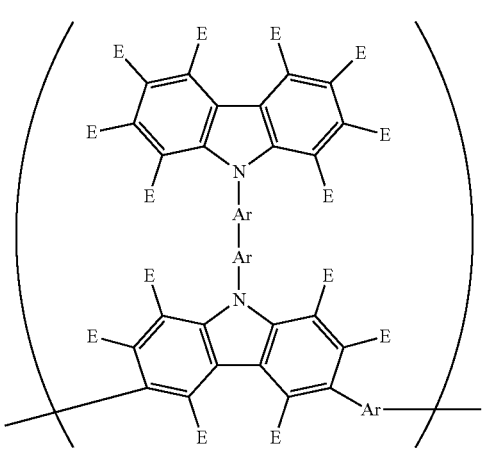 (57a)
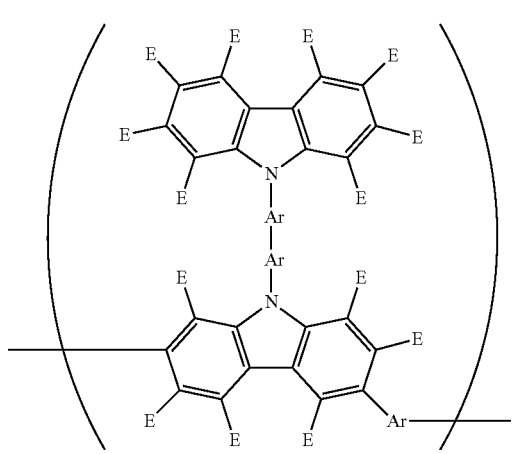 (60a)

[Chemical Formula 15]
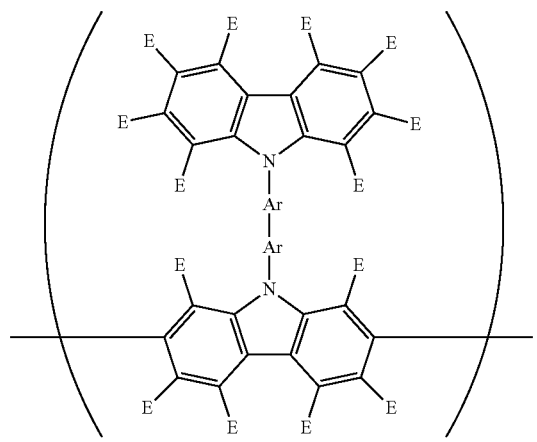
(61a)
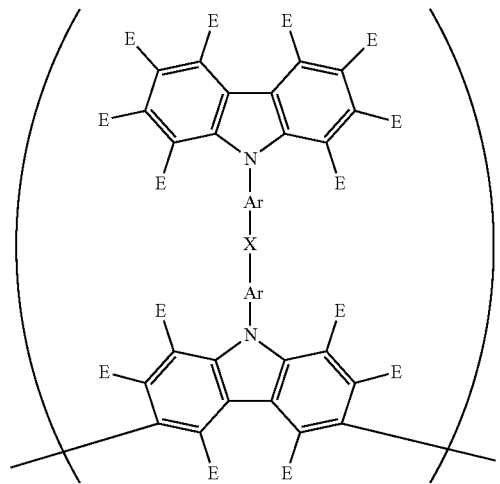
(62a)
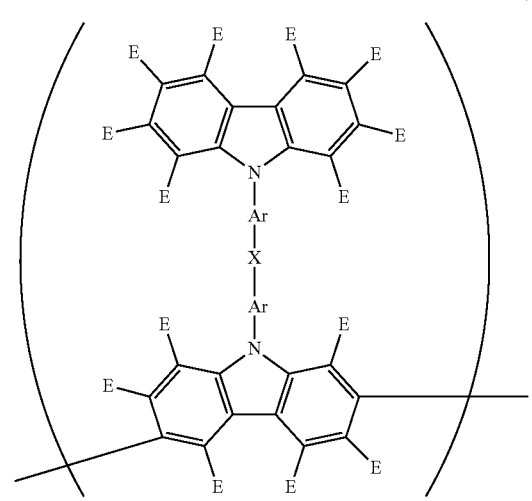
(63a)
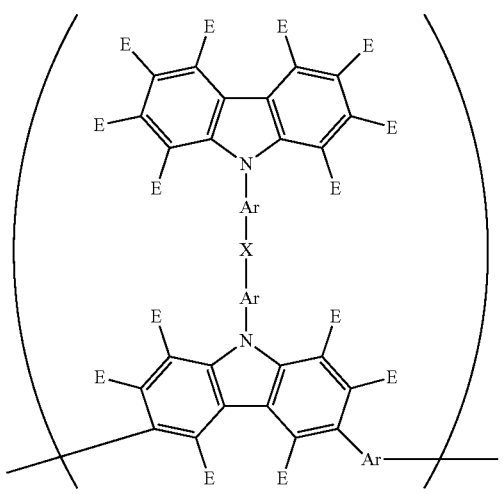
(64a)
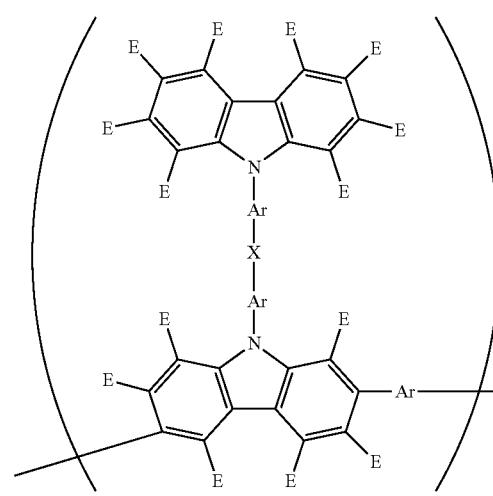
(65a)
[Chemical Formula 16]
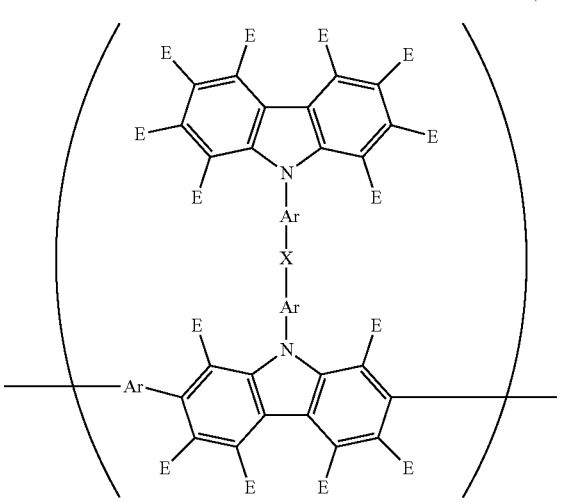
(66a)

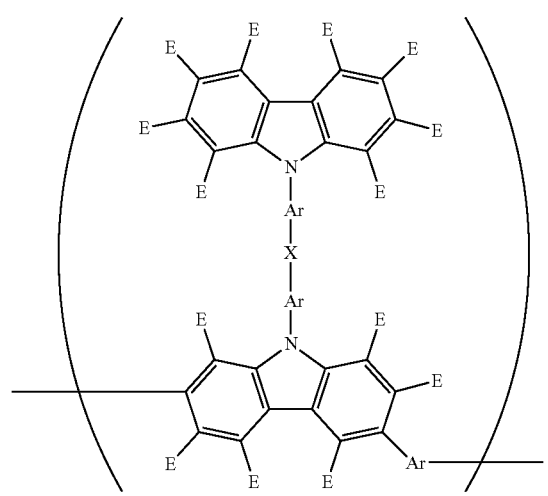
(67a)
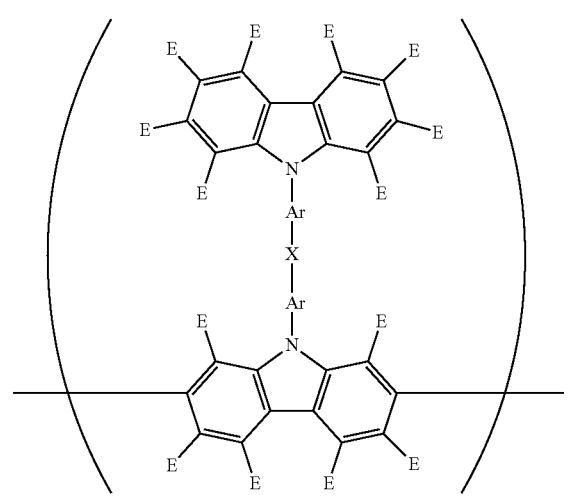
(68a)
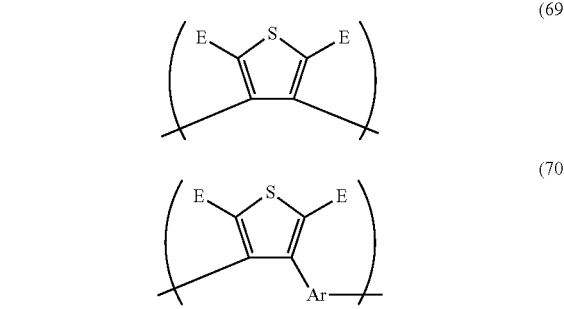
(69a)
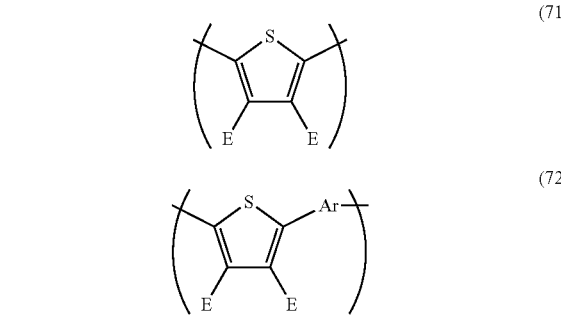
(70a)
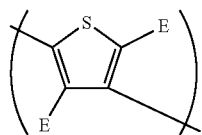
(73a)
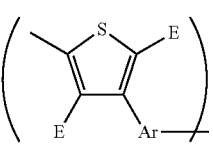
(74a)
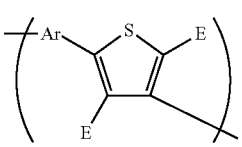
(75a)
[Chemical Formula 17]
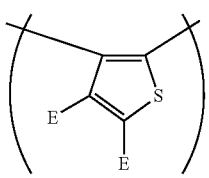
(76a)
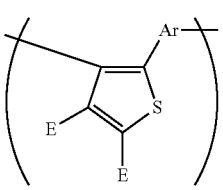
(77a)
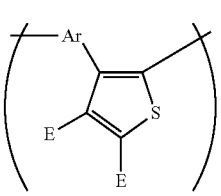
(78a)
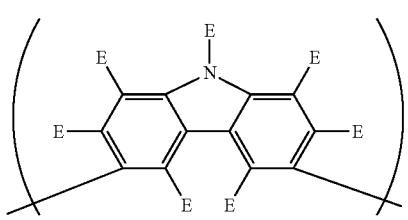
(79a)
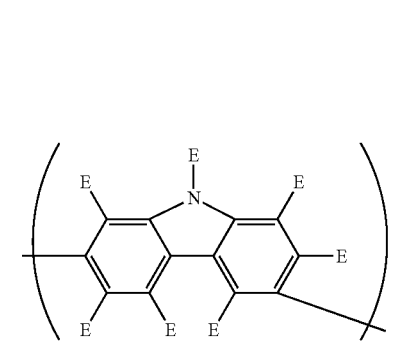
(80a)
(71a)
(72a)

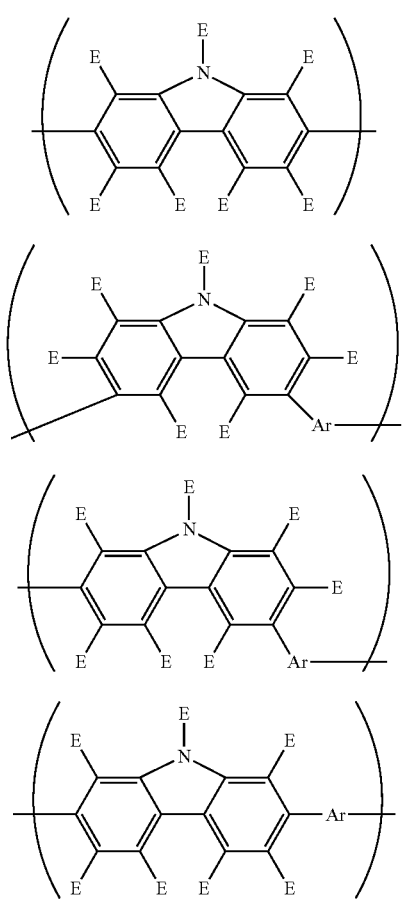

(81a)
(82a)
(83a)
(84a)

In formulas (1a) to (84a), each E independently represents —$R^1$, —$OR^2$, —$SR^3$, —$OCOR^4$, —$COOR^5$, —$SiR^6R^7R^8$, any of formulas (1) to (3) shown below, or a group having a polymerizable substituent.

[Chemical Formula 18]

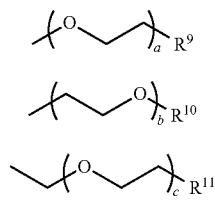

(1)
(2)
(3)

Each of $R^1$ to $R^{11}$ represents a hydrogen atom, a linear, cyclic or branched alkyl group having a carbon number of 1 to 22, or an aryl group or heteroaryl group having a carbon number of 2 to 30, and each of a, b and c represents an integer of 1 or greater. Here, an aryl group is an atom grouping in which one hydrogen atom has been removed from an aromatic hydrocarbon, and may have a substituent, whereas a heteroaryl group is an atom grouping in which one hydrogen atom has been removed from an aromatic compound having a hetero atom, and may have a substituent.

Examples of the substituent include an alkyl group, alkoxy group, alkylthio group, aryl group, aryloxy group, arylthio group, arylalkyl group, arylalkoxy group, arylalky- lthio group, arylalkenyl group, arylalkynyl group, hydroxyl group, hydroxyalkyl group, amino group, substituted amino group, silyl group, substituted silyl group, silyloxy group, substituted silyloxy group, halogen atom, acyl group, acyloxy group, imino group, amide group (—(NH)—COR), imide group (—N(COR)$_2$), carboxyl group, substituted carboxyl group, cyano group and monovalent heterocyclic group. Further, each of a, b and c is preferably an integer of 1 to 4.

Examples of the polymerizable substituent include an oxetanyl group (oxetane group), epoxy group (oxiranyl group), vinyl ether group (vinyloxy group), acrylate group (acryloyloxy group) and methacrylate group (methacryloy- loxy group). Examples of the group having a polymerizable substituent include an alkyl group or alkylene oxide group or the like in which at least one hydrogen atom has been substituted with one of the above polymerizable substitu- ents.

In the above description, examples of the alkyl group include a methyl group, ethyl group, n-propyl group, n-butyl group, n-pentyl group, n-hexyl group, n-heptyl group, n-oc- tyl group, n-nonyl group, n-decyl group, n-undecyl group, n-dodecyl group, isopropyl group, isobutyl group, sec-butyl group, tert-butyl group, 2-ethylhexyl group, 3,7-dimethyl- octyl group, cyclohexyl group, cycloheptyl group and cyclooctyl group. Examples of the aryl group include phe- nyl, biphenylyl, terphenylyl, naphthalenyl anthracenyl, tet- racenyl, fluorenyl and phenanthrenyl groups. Examples of the heteroaryl group include pyridinyl, pyrazinyl, quinoli- nyl, isoquinolinyl, acridinyl, phenanthrolinyl, furanyl, pyr- rolyl, thiophenyl, carbazolyl, oxazolyl, oxadiazolyl, thiadi- azolyl, triazolyl, benzoxazolyl, benzoxadiazolyl, benzothiadiazolyl, benzotriazolyl and benzothiophenyl groups. These examples can also be used for subsequent mentions of alkyl groups, aryl groups and heteroaryl groups in the following description.

Each Ar independently represents an arylene group or heteroarylene group having a carbon number of 2 to 30, or an aryl group or heteroaryl group having a carbon number of 2 to 30. An arylene group is an atom grouping in which two hydrogen atoms have been removed from an aromatic hydrocarbon, and may have a substituent, whereas a het- eroarylene group is an atom grouping in which two hydro- gen atoms have been removed from an aromatic compound having a hetero atom, and may have a substituent. Further, an aryl group is an atom grouping in which one hydrogen atom has been removed from an aromatic hydrocarbon, and may have a substituent, whereas a heteroaryl group is an atom grouping in which one hydrogen atom has been removed from an aromatic compound having a hetero atom, and may have a substituent. Examples of the substituent include the same groups as those mentioned above for E. In a similar manner to that described above for the terms aryl group and heteroaryl group, the terms arylene group and heteroarylene group include condensed ring groups and groups in which two or more rings are bonded together.

Examples of the arylene group include phenylene, biphe- nyl-diyl, terpheyl-diyl, naphthalene-diyl, anthracene-diyl, tetracene-diyl, fluorene-diyl and phenanthrene-diyl groups. Examples of the heteroarylene groups include pyridine-diyl, pyrazine-diyl, quinoline-diyl, isoquinoline-diyl, acridine- diyl, phenanthroline-diyl, furan-diyl, pyrrole-diyl, thio- phene-diyl, carbazole-diyl, oxazole-diyl, oxadiazole-diyl, thiadiazole-diyl, triazole-diyl, benzoxazole-diyl, benzoxadi- azole-diyl, benzothiadiazole-diyl, benzotriazole-diyl and benzothiophene-diyl groups. These examples can also be used for subsequent mentions of arylene groups and heteroarylene groups in the following description.

Each of X and Z independently represents a divalent linking group, and although there are no particular limitations, a group in which one additional hydrogen atom has been removed from one of the aforementioned E groups having one or more hydrogen atoms, or a group of the linking group set (A) described below is preferred. Further, x represents an integer of 0 to 2. Y represents a trivalent linking group, and although there are no particular limitations, a group in which two additional hydrogen atoms have been removed from one of the aforementioned E groups having two or more hydrogen atoms is preferred.

<Linking Group Set (A)>

[Chemical Formula 19]

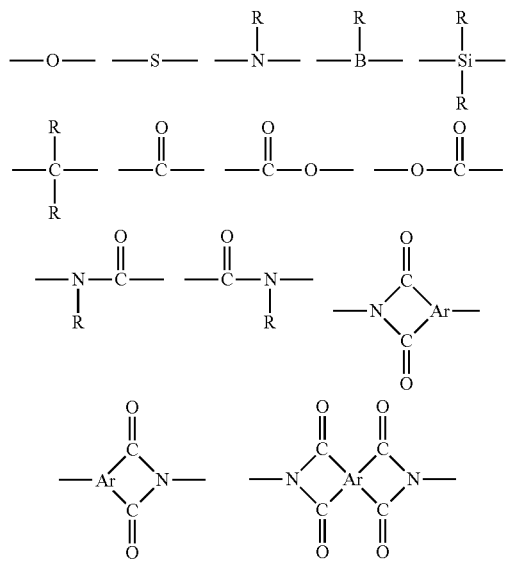

In the above formulas, each R independently represents a hydrogen atom, a linear, cyclic or branched alkyl group having a carbon number of 1 to 22 which may have a substituent, or an aryl group or heteroaryl group having a carbon number of 2 to 30 which may have a substituent. Ar represents a trivalent or tetravalent linking group, and is preferably an atom grouping in which an additional one or two hydrogen atoms have been removed from an arylene group or heteroarylene group having a carbon number of 2 to 30.

<Formulas (85a) to (93a)>

[Chemical Formula 20]

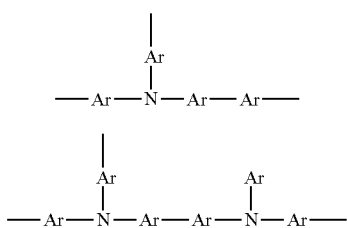

(85a)

(86a)

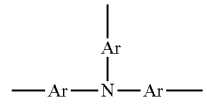 (87a)

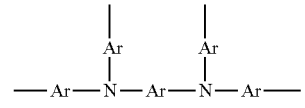 (88a)

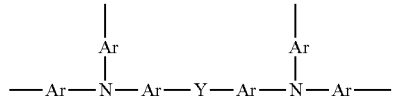 (89a)

[Chemical Formula 21]

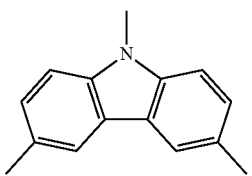 (90a)

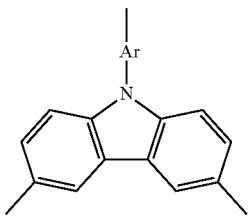 (91a)

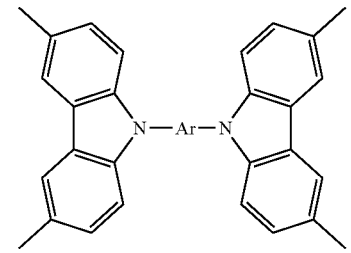 (92a)

(93a)

In formulas (85a) to (93a), each Ar independently represents an arylene group or heteroarylene group having a carbon number of 2 to 30, or an aryl group or heteroaryl group having a carbon number of 2 to 30, and Y represents a divalent linking group. The units represented by formulas (85a) to (93a) may have a substituent, and examples of the substituent include the same groups as those mentioned above for E in formulas (1a) to (84a).

Y in formulas (89a) and (93a) is preferably a divalent linking group represented by one of the following formulas.

[Chemical Formula 22]

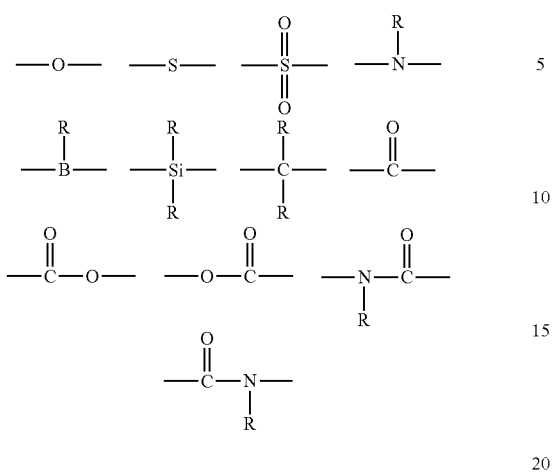

In the above formulas, each R independently represents a hydrogen atom, a linear, cyclic or branched alkyl group having a carbon number of 1 to 22 which may have a substituent, or an aryl group or heteroaryl group having a carbon number of 2 to 30 which may have a substituent.

The hole-transporting polymer or oligomer may be a copolymer having two or more units constituting the polymer or oligomer chain. The copolymer may be an alternating, random, block or graft copolymer, or a copolymer having an intermediate type structure, such as a random copolymer having block-like properties.

In order to adjust the solubility, the heat resistance or the electrical properties, the hole-transporting polymer or oligomer may be a copolymer which, in addition to the units described above, includes an aforementioned arylene group or heteroarylene group, or a structure represented by one of formulas (1) to (31) shown below, as a copolymer unit. The units represented by formulas (29) to (31) are units that can become a branch origin.

<Formulas (1) to (28)>

[Chemical Formula 23]

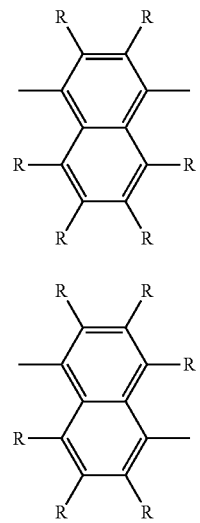

(1)

(2)

(3)

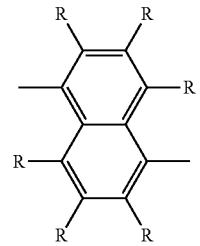

(4)

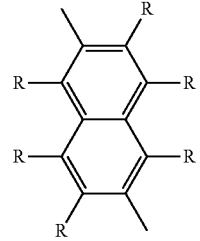

(5)

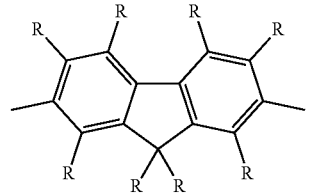

(6)

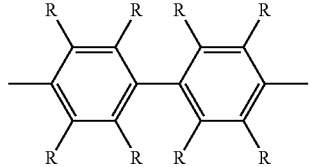

(7)

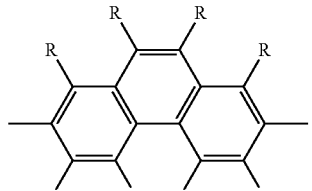

(8)

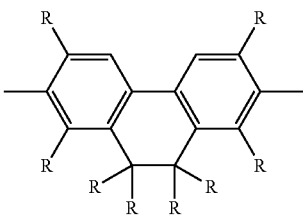

(9)

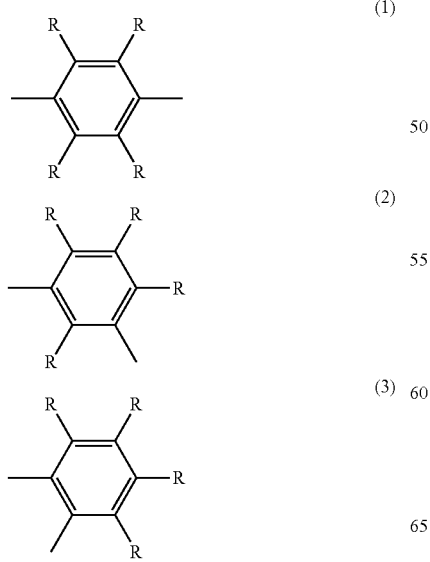

(10)

(11) 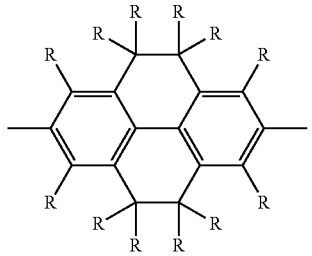
(12) 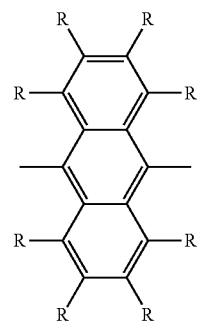
(13) 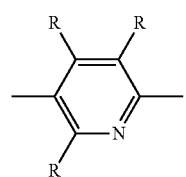
(14) 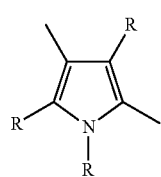
(15) 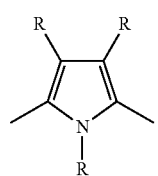
(16) 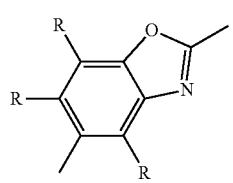
(17) 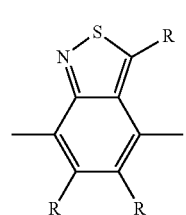
(18) 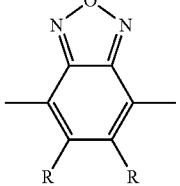
(19) 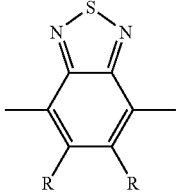
(20) 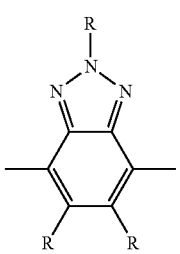
(21) 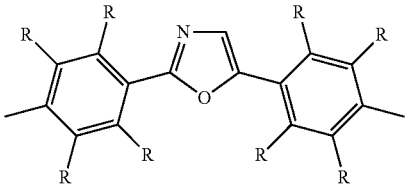
(22) 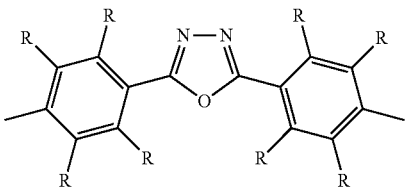
(23) 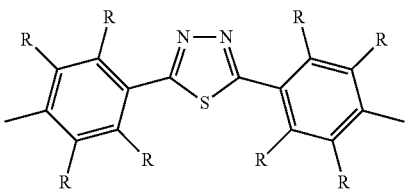
(24) 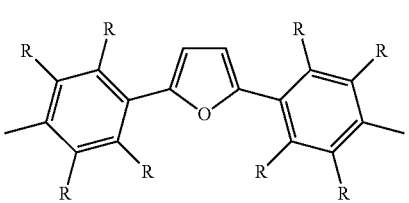

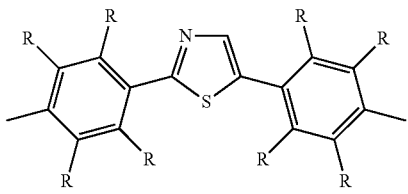

(25)

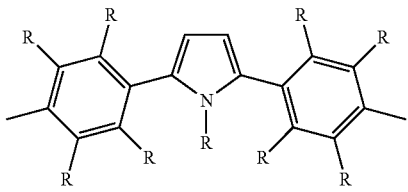

(26)

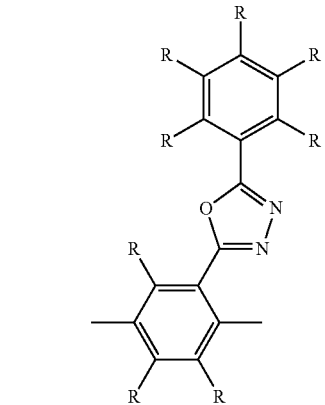

(27)

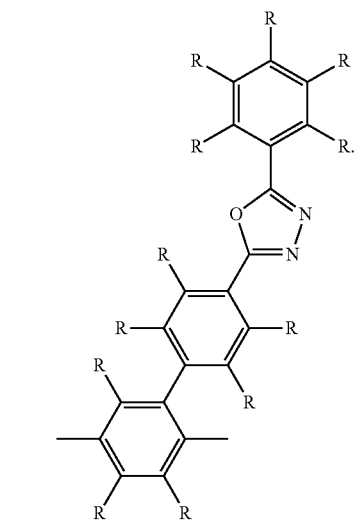

(28)

In formulas (1) to (28), examples of R include the same groups as those mentioned above for E in formulas (1a) to (84a).

<Formulas (29) to (31)>

[Chemical Formula 24]

(29)

(30)

(31)

In formulas (29) to (31), W represents a trivalent linking group, and is preferably an atom grouping in which an additional one hydrogen atom has been removed from an arylene group or heteroarylene group having a carbon number of 2 to 30. Each Ar independently represents an arylene group or heteroarylene group having a carbon number of 2 to 30, and Z represents a carbon atom, silicon atom or phosphorus atom. Each of the units represented by formulas (29) to (31) may have a substituent, and examples of the substituent include the same groups as those mentioned above for E in formulas (1a) to (84a).

The hole-transporting polymer or oligomer may have a polymerizable substituent at a terminal of the molecular chain. In such a case, a monomer having an oxetanyl group, epoxy group (oxiranyl group), vinyl ether group (vinyloxy group), acrylate group (acryloyloxy group), or methacrylate group (methacryloyloxy group) or the like can be used as the monomer for introducing the polymerizable substituent. Specific examples of the monomer include monomers having a polymerizable substituent, and also having an aromatic hydrocarbon structure or an aromatic compound structure containing a hetero atom.

From the viewpoint of enabling another layer to be easily laminated onto the layer having hole transport properties by a coating method, the hole-transporting polymer or oligomer preferably has a polymerizable substituent at the molecular chain terminals or on a side chain.

From the viewpoints of suppressing crystallization and obtaining favorable film-forming properties, the weight-average molecular weight of the hole-transporting polymer or oligomer is preferably at least 1,000, more preferably at least 2,000, and still more preferably 3,000 or greater. Further, from the viewpoint of improving the solubility in the solvent, the weight-average molecular weight of the hole-transporting polymer or oligomer is preferably not more than 1,000,000, more preferably not more than 900,000, and still more preferably 800,000 or less. The weight-average molecular weight refers to the polystyrene-equivalent weight-average molecular weight determined by gel permeation chromatography (GPC).

More specifically, the weight-average molecular weight of the hole-transporting polymer or oligomer is preferably from 1,000 to 1,000,000, more preferably from 2,000 to 900,000, and still more preferably from 3,000 to 800,000.

From the viewpoint of ensuring favorable film formation stability, the average value for the number of units within the hole-transporting polymer or oligomer is preferably at least 2, more preferably at least 5, and still more preferably 10 or greater. Further, from the viewpoint of improving the solubility in the solvent, and from the viewpoint of ensuring a satisfactory change in solubility, thus enabling easy lamination of an organic layer, in those cases where the polymer or oligomer has a polymerizable substituent, the average value for the number of units is preferably not more than 1,000, more preferably not more than 500, and still more preferably 200 or less. The "average value for the number of units" can be determined from the weight-average molecular weight of the hole-transporting polymer or oligomer, the molecular weight of each of the units, and the proportion of each unit within the hole-transporting polymer or oligomer. The "proportion of each unit" can be determined from the ratio (molar ratio) between the monomers corresponding with the various repeating units used in synthesizing the polymer or oligomer.

More specifically, the average value for the number of units within the hole-transporting polymer or oligomer is preferably from 2 to 1,000, more preferably from 5 to 500, and still more preferably from 10 to 200.

Further, from the viewpoint of obtaining superior hole transport properties, the proportion of units represented by any of formulas (1a) to (93a) relative to the total number of units within the hole-transporting polymer or oligomer is preferably at least 10%, more preferably at least 25%, and still more preferably 50% or greater. Further, the proportion of units represented by any of formulas (1a) to (93a) may be 100%, but if consideration is given to factors such as the introduction of polymerizable substituents at the terminals, then the proportion is preferably not more than 95%, more preferably not more than 90%, and still more preferably 80% or less.

More specifically, the proportion of units represented by any of formulas (1a) to (93a) relative to the total number of units within the hole-transporting polymer or oligomer is preferably from 10 to 95%, more preferably from 25 to 90%, and still more preferably from 50 to 80%.

If the hole-transporting polymer or oligomer has a branched structure, then from the viewpoint of obtaining a satisfactory weight-average molecular weight, and from the viewpoint of increasing the number of terminals with an introduced polymerizable substituent, thereby increasing the change in solubility, the proportion of units represented by any of formulas (85a) to (93a) and formulas (29) to (31) relative to the total number of units within the hole-transporting polymer or oligomer is preferably at least 1%, more preferably at least 3%, and still more preferably 10% or greater. Further, from the viewpoint of preventing synthesis failure due to gelling during synthesis of the hole-transporting polymer or oligomer, the proportion of units represented by any of formulas (85a) to (93a) and formulas (29) to (31) is preferably not more than 50%, more preferably not more than 30%, and still more preferably 25% or less.

More specifically, the proportion of units represented by any of formulas (85a) to (93a) and formulas (29) to (31) relative to the total number of units within the hole-transporting polymer or oligomer is preferably from 1 to 50%, more preferably from 3 to 30%, and still more preferably from 10 to 25%.

The hole-transporting polymer or oligomer can be produced using various synthesis methods well known to those in the art. For example, in those cases where each of the monomer units used in the synthesis of the hole-transporting polymer or oligomer has an aromatic ring, and the polymer or oligomer is produced by bonding aromatic rings together, methods that can be used include those disclosed by T. Yamamoto et al., Bull. Chem. Soc. Jpn., vol. 51, No. 7, page 2091 (1978), M. Zembayashi et al., Tet. Lett., vol. 47, page 4089 (1977), and A. Suzuki, Synthetic Communications, vol. 11, No. 7, page 513 (1981). In particular, the method described by A. Suzuki is typical for the production of a hole-transporting polymer or oligomer. Monomer units corresponding with the units described above can be used as the various monomer units.

The method disclosed by A. Suzuki is a method of causing a cross-coupling reaction (commonly called the "Suzuki reaction") between an aromatic boronic acid derivative and an aromatic halide using a Pd catalyst. By bonding together the desired aromatic rings, a hole-transporting polymer or oligomer can be produced.

Further, in the Suzuki reaction, a soluble Pd compound such as a Pd(II) salt or a Pd(0) complex is typically used as the Pd catalyst. Examples of preferred Pd sources include $Pd(Ph_3P)_4$, and a $Pd(OAc)_2$ complex, a $Pd_2(dba)_3$ complex and a $PdCl_2(dppf)$ complex with a tertiary phosphine ligand, which can be used in an amount of 0.01 to 5 mol % relative to the amount of aromatic reactants.

In this reaction, a base is typically also used, and the base is preferably an aqueous alkali carbonate or bicarbonate, or a tetraalkylammonium hydroxide. Further, a phase transfer catalyst may be used to promote the reaction in non-polar solvents. Examples of solvents that can be used include N,N-dimethylformamide, toluene, anisole, dimethoxyethane and tetrahydrofuran.

[Hole-Transporting Low-Molecular Weight Compound]

The hole-transporting low-molecular weight compound may be any compound with the capability of transporting holes, and examples include triazole derivatives, oxadiazole derivatives, imidazole derivatives, pyrazoline derivatives, pyrazolone derivatives, phenylenediamine derivatives, arylamine derivatives, carbazole derivatives, styrylanthracene derivatives, fluorenone derivatives, hydrazone derivatives and stilbene derivatives. Further examples include low-molecular weight compounds having one of the units represented by any of the aforementioned formulas (1a) to (93a) within the molecule.

Commercially available conventional compounds may be used as the hole-transporting polymer or oligomer, or the hole-transporting low-molecular weight compound.

The layer having hole transport properties may be formed by a dry process such as vacuum deposition or sputtering, or formed via a wet process such as inkjet printing. The coating method used in the wet process may employ the same methods as the coating methods used for applying the treatment liquid.

A composition containing the hole-transporting compound and a solvent is typically used for the coating process. The amount of the solvent in such a composition may be determined with due consideration of the applicability of the composition to various coating methods. For example, the amount of solvent may be set so that the proportion of the hole-transporting compound relative to the solvent is preferably at least 0.1% by mass, more preferably at least 0.2% by mass, and still more preferably 0.5% by mass or greater. Further, the amount of solvent is set so that the proportion of the hole-transporting compound relative to the solvent is preferably not more than 10% by mass, more preferably not more than 5% by mass, and still more preferably 3% by mass or less. More specifically, the amount of the solvent in the composition is set so that the proportion of the hole-transporting compound relative to the solvent is preferably from 0.1 to 10% by mass, more preferably from 0.2 to 5% by mass, and still more preferably from 0.5 to 3% by mass.

The composition may also contain other additives such as polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

The thickness of the layer having hole transport properties may be set as appropriate depending on the application. For example, the thickness may be set within a range from 5 nm to 10 µm. Particularly in those cases where the layer having hole transport properties is used as a hole injection layer and/or a hole transport layer of an organic EL element, from the viewpoint of moderating the surface roughness of the anode and reducing the possibility of short-circuits, the thickness of the layer having hole transport properties is preferably at least 5 nm, more preferably at least 10 nm, and still more preferably 20 nm or greater. Further, from the viewpoint of reducing the drive voltage of the organic EL element, the thickness of the layer having hole transport properties is preferably not more than 500 nm, more preferably not more than 200 nm, and still more preferably 100 nm or less. Specifically, the thickness is preferably from 5 to 500 nm, more preferably from 10 to 200 nm, and still more preferably from 20 to 100 nm.

[Organic Electronic Element and Production Method Therefor]

The organic electronic element that represents one embodiment of the present invention has an anode, a surface to which the ionic compound has been adhered, a layer (A) having hole transport properties, and a cathode, in that order. The organic electronic element may also contain one or more optional layers positioned between the above layers, and may have a substrate. Further, the method for producing an organic electronic element that represents another embodiment of the present invention has a step of forming an anode, a step of forming a layer (A) having hole transport properties, and a step of forming a cathode, the method also having at least one step selected from among a step of adhering an ionic compound to the surface on which the layer (A) having hole transport properties is to be formed, and a step of adhering an ionic compound to the surface of the layer (A) having hole transport properties. The method for producing an organic electronic element may also include one or more other optional steps in addition to the above steps. Examples of the organic electronic element include an organic EL element and an organic photoelectric conversion element.

[Organic EL Element]

Figure 6:
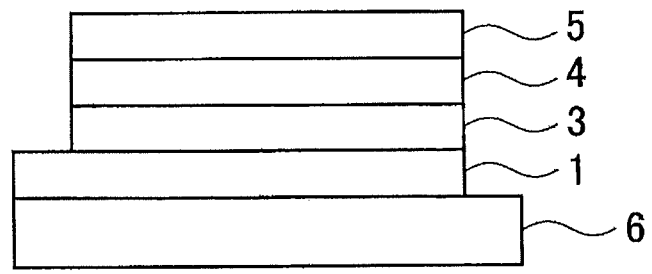
FIG. 6 is a schematic cross-sectional view illustrating one example of a conventional organic EL element.

A conventional organic EL element includes an anode, a light-emitting layer and a cathode, in that order, and may also include other layers such as a hole injection layer, electron injection layer, hole transport layer or electron transport layer. The organic EL element may also have a substrate. FIG. 6 illustrates one example of a conventional organic EL element. On the other hand, the organic EL element that represents one embodiment of the present invention includes at least an anode, a surface to which the ionic compound has been adhered, a layer (A) having hole transport properties, and a cathode, in that order. The layer (A) having hole transport properties can function as a light-emitting layer and as another layer, and preferably functions as a hole injection layer and/or a hole transport layer. Accordingly, one example of the organic EL element of the present embodiment includes, an anode, a surface to which the ionic compound has been adhered, a layer (A) having hole transport properties that functions as a hole injection layer and/or hole transport layer, and a cathode, in that order. Specific examples of the ionic compound are as described above.

The ionic compound can be adhered by a wet process such as a coating method or a dry process such as a vapor deposition method. The adhesion of the ionic compound is preferably performed by applying the treatment liquid described above.

For example, in the case where the organic EL element includes, in order, a substrate, an anode, a surface to which the ionic compound has been adhered, a layer (A) having hole transport properties that functions as a hole injection layer, a light-emitting layer and a cathode, examples of the method for producing the organic EL element include the methods described below.

A production method including, in order, (1) a step of forming the anode on the substrate, (2) a step of applying the treatment liquid to a surface of the anode (namely, the surface on which the layer (A) having hole transport properties is to be formed), (3) a step of forming the layer (A) having hole transport properties on the surface of the anode to which the treatment liquid has been applied, (4) a step of forming the light-emitting layer, and (5) a step of forming the cathode. In this method, the surface of the anode is the surface to which the ionic compound has been adhered.

An alternative method includes, in order, (1) a step of forming the cathode on the substrate, (2) a step of forming the light-emitting layer, (3) a step of forming the layer (A) having hole transport properties, (4) a step of applying the treatment liquid to the surface of the layer (A) having hole transport properties, and (5) a step of forming the anode. In this method, the surface of the layer (A) having hole transport properties is the surface to which the ionic compound has been adhered.

Either method may also include, either between, before or after the various steps, additional optional steps such as a step of forming an electron injection layer, a step of forming an electron transport layer, a washing step, and an encapsulation step.

Figure 3:
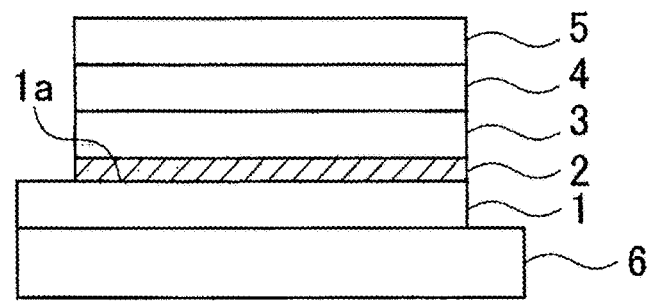
FIG. 3 is a schematic cross-sectional view illustrating one example of an embodiment of an organic EL element.

FIG. 3 illustrates a schematic cross-sectional view of one example of an organic EL element having a substrate 6, an anode 1, a surface 1a to which an ionic compound is adhered, a layer (A) 3 having hole transport properties that functions as a hole injection layer, a light-emitting layer 4 and a cathode 5. In FIG. 3, the surface 1a to which the ionic compound is adhered and the layer (A) 3 having hole transport properties make contact via a coating film 2. However, in cases such as when the coating film 2 includes non-continuous portions, the surface 1a to which the ionic compound is adhered and the layer (A) 3 having hole transport properties may also make direct contact.

Further, the organic EL element may also have a layer (B) having hole transport properties between the anode and the layer (A) having hole transport properties. For example, in the case where the organic EL element includes, in order, a substrate, an anode, a layer (B) having hole transport properties that functions as a hole injection layer, a surface to which an ionic compound is adhered, a layer (A) having hole transport properties that functions as a hole transport layer, a light-emitting layer and a cathode, examples of the method for producing the organic EL element include the methods described below.

A production method including, in order, (1) a step of forming the anode on the substrate, (2) a step of forming the layer (B) having hole transport properties, (3) a step of applying the treatment liquid to the surface of the layer (B) having hole transport properties (namely, the surface on which the layer (A) having hole transport properties is to be formed), (4) a step of forming the layer (A) having hole transport properties on the surface of the layer (B) having hole transport properties to which the treatment liquid has been applied, (5) a step of forming the light-emitting layer, and (6) a step of forming the cathode. In this method, the surface of the layer (B) having hole transport properties is the surface to which the ionic compound has been adhered.

An alternative method includes, in order, (1) a step of forming the cathode on the substrate, (2) a step of forming the light-emitting layer, (3) a step of forming the layer (A) having hole transport properties, (4) a step of applying the treatment liquid to the surface of the layer (A) having hole transport properties, (5) a step of forming the layer (B) having hole transport properties, and (6) a step of forming the anode. In this method, the surface of the layer (A) having hole transport properties is the surface to which the ionic compound has been adhered.

Either method may also include, either between, before or after the various steps, additional optional steps such as a step of forming an electron injection layer, a step of forming an electron transport layer, a washing step, and an encapsulation step. Further, the former production method may have "a step of applying the treatment liquid to the surface of the anode (namely, the surface on which the layer (B) having hole transport properties is to be formed)" between step (1) and step (2), whereas the latter production method may have "a step of applying the treatment liquid to the surface of the layer (B) having hole transport properties" between step (5) and step (6).

Figure 4:
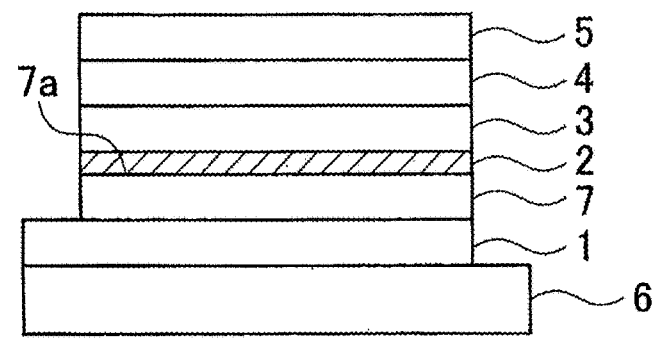
FIG. 4 is a schematic cross-sectional view illustrating one example of an embodiment of an organic EL element.

FIG. 4 illustrates a schematic cross-sectional view of one example of an organic EL element having a substrate 6, an anode 1, a layer (B) 7 having hole transport properties that functions as a hole injection layer, a surface 7a to which an ionic compound is adhered, a layer (A) 3 having hole transport properties that functions as a hole transport layer, a light-emitting layer 4 and a cathode 5. In FIG. 4, the surface 7a to which the ionic compound is adhered and the layer (A) 3 having hole transport properties make contact via a coating film 2. However, the surface 7a to which the ionic compound is adhered and the layer (A) 3 having hole transport properties may also make direct contact in some cases. In the organic EL element illustrated in FIG. 4, the surface of the anode 1 may also be a surface to which an ionic compound is adhered.

In the organic EL element, depending on factors such as the amount of the ionic compound adhered, the method used for adhering the ionic compound, the state following adhesion, and the effects of the layers laminated on the surface to which the ionic compound has been adhered, the existence of the ionic compound on the surface to which the ionic compound has been adhered can sometimes not be confirmed. For example, in the case where a treatment liquid has been applied, it is sometimes impossible to confirm following application whether a "continuous coating film" or a "coating film having non-continuous portions" has been formed. However, by including a surface to which an ionic compound has been adhered, and preferably a surface to which the aforementioned treatment liquid has been applied, effects including improvements in properties such as the current efficiency and the lifespan can be obtained for the organic EL element.

Descriptions of Each of the Layers of the Organic EL Element are Presented Below.

[Light-Emitting Layer]

The material used for the light-emitting layer may be a low-molecular weight compound, a polymer or oligomer, or a dendrimer or the like. Examples of low-molecular weight compounds that use fluorescence emission include perylene, coumarin, rubrene, quinacridone, color laser dyes (such as rhodamine and DCM1), aluminum complexes (such as tris(8-hydroxyquinolinato)aluminum(III) ($Alq_3$)), stilbene, and derivatives of these compounds. Examples of polymers or oligomers using fluorescence emission that can be used favorably include polyfluorene, polyphenylene, polyphenylenevinylene (PPV), polyvinylcarbazole (PVK), fluorene-benzothiadiazole copolymers, fluorene-triphenylamine copolymers, and derivatives and mixtures of these compounds.

On the other hand, in recent years, in order to further improve the efficiency of organic EL elements, phosphorescent organic EL elements are also being actively developed. In a phosphorescent organic EL element, not only singlet state energy, but also triplet state energy can be used, and therefore the internal quantum yield can, in principle, be increased to 100%. In a phosphorescent organic EL element, a metal complex-based phosphorescent material containing a heavy metal such as platinum or iridium is used as a phosphorescence-emitting dopant for doping a host material, thus enabling the extraction of a phosphorescence emission (see M. A. Baldo et al., Nature, vol. 395, p. 151 (1998), M. A. Baldo et al., Applied Physics Letters, vol. 75, p. 4 (1999), M. A. Baldo et al., Nature, vol. 403, p. 750 (2000)).

In the organic EL element that represents an embodiment of the present invention, a phosphorescent material can be used for the light-emitting layer in order to increase the element efficiency. Examples of materials that can be used favorably as the phosphorescent material include metal complexes and the like containing Ir or Pt or the like as a central metal. Specific examples of Ir complexes include Flr(pic) (iridium(III) bis[(4,6-difluorophenyl)-pyridinato-N, $C^2$]picolinate) which emits blue light, $Ir(ppy)_3$ (fac-tris(2-phenylpyridine)iridium) which emits green light (see M. A. Baldo et al., Nature, vol. 403, p. 750 (2000)), and $(btp)_2Ir$ (acac) {bis[2-(T-benzo[4,5-α]thienyl)pyridinato-N,$C^3$] iridium(acetyl-acetonate)} (see Adachi et al., Appl. Phys. Lett., 78 No. 11, 2001, 1622) and $Ir(piq)_3$ (tris(1-phenylisoquinoline)iridium) which emit red light. Specific examples of Pt complexes include platinum 2,3,7,8,12,13,17,18-octaethyl-21H,23H-porphyrin (PtOEP) which emits red light. The phosphorescent material can use a low-molecular weight compound or a dendrite such as an iridium core dendrimer. Derivatives of these compounds can also be used favorably.

Further, when a phosphorescent material is incorporated in the light-emitting layer, a host material is preferably included in addition to the phosphorescent material. The host material may be a low-molecular weight compound, a polymer or oligomer, or a dendrimer or the like.

Examples of low-molecular weight compounds that can be used include CBP (4,4'-bis(carbazol-9-yl)-biphenyl), mCP (1,3-bis(9-carbazolyl)benzene), CDBP (4,4'-bis(carbazol-9-yl)-2,2'-dimethylbiphenyl) and α-NPD (4,4'-bis[(1-naphthyl)phenylamino]-1,1'-biphenyl. Examples of polymers or oligomers that can be used include polyvinylcarbazole, polyphenylene and polyfluorene. Further, derivatives of these compounds can also be used.

The light-emitting layer may be formed by a vapor deposition method or a coating method. Forming the light-emitting layer by a coating method enables the organic EL element to be formed more cheaply, and is consequently preferred. Formation of the light-emitting layer by a coating method can be achieved by using a conventional coating method to apply a solution containing the phosphorescent material, and if necessary a host material, to a desired substrate. Examples of the coating method include spin coating methods, casting methods, dipping methods, and printing methods such as relief printing, intaglio printing, offset printing, lithographic printing, relief reversal offset printing, screen printing, gravure printing and inkjet printing.

[Cathode]

The cathode material is preferably a metal or a metal alloy, such as Li, Ca, Mg, Al, In, Cs, Ba, Mg/Ag, LiF or CsF.

[Anode]

A metal (for example, Au) or another material having metal-like conductivity can be used as the anode. Examples of the other materials include oxides (for example, ITO: indium oxide/tin oxide) and conductive polymers (for example, polythiophene-polystyrene sulfonate mixtures (PEDOT:PSS)).

[Electron Transport Layer, Electron Injection Layer]

Examples of materials for the electron transport layer and the electron injection layer include phenanthroline derivatives (such as 2,9-dimethyl-4,7-diphenyl-1,10-phenanthroline (BCP)), bipyridine derivatives, nitro-substituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives (such as 2-(4-biphenylyl)-5-(4-tert-butylphenyl-1,3,4-oxadiazole (PBD)), and aluminum complexes (such as tris(8-hydroxyquinolinato)aluminum(III) (Alq$_3$) and bis(2-methyl 8-quinolinolato)-4-phenylphenolate aluminum (III) (Balq)). Moreover, thiadiazole derivatives in which the oxygen atom in the oxadiazole ring of the oxadiazole derivatives mentioned above has been substituted with a sulfur atom, and quinoxaline derivatives having a quinoxaline ring that is well known as an electron-withdrawing group can also be used.

[Substrate]

In terms of substrates that can be used in the organic EL element, various types of glass and plastic can be used without any particular restrictions. Further, a transparent substrate is preferable, and glass, quartz and light-transmitting resin films and the like can be used favorably. If a resin film is used, then the organic EL element can also be imparted with flexibility (namely, a flexible substrate), which is particularly desirable.

Examples of the resin film include polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC) and cellulose acetate propionate (CAP).

Furthermore, in those cases when a resin film is used, an inorganic substance such as silicon oxide or silicon nitride may be coated onto the resin film to inhibit the transmission of water vapor and oxygen and the like.

[Encapsulation]

The organic EL element that represents an embodiment of the present invention may be encapsulated to reduce the effect of the outside atmosphere and extend the life of the element. Materials that can be used for the encapsulation include glass, plastic films such as epoxy resins, acrylic resins, PET and PEN, and inorganic substances such as silicon oxide and silicon nitride. There are no particular limitations on the encapsulation method. Examples of methods that can be used include methods in which the encapsulation material is formed directly on the organic EL element by vacuum deposition, sputtering, or a coating method or the like, and methods in which an encapsulation material such as glass or a plastic film is bonded to the organic EL element with an adhesive.

[Emission Color]

Although there are no particular limitations on the color of the light emission from the organic EL element, white light-emitting elements can be used for various lighting fixtures, including domestic lighting, in-vehicle lighting, watches and liquid crystal backlights, and are consequently preferred.

Because generating white light emission from a single material is currently impossible, the method used for forming a white light-emitting element involves using a plurality of light-emitting materials to emit a plurality of colors simultaneously, and then mixing the emitted colors to obtain a white light emission. There are no particular limitations on the combination of the plurality of emission colors, and examples include combinations that include three maximum emission wavelengths for blue, green and red, and combinations that include two maximum emission wavelengths and utilize the complementary color relationship between blue and yellow, or yellowish green and orange. Further, control of the emission color can also be achieved by appropriate adjustment of the type and amount of the phosphorescent material.

[Display Element, Illumination Device, Display Device]

The display element includes the organic EL element described above.

For example, by using the organic EL element described above as the element corresponding with each color pixel, such as red, green and blue (RGB), a color display element can be obtained.

Image formation may employ a simple matrix in which organic EL elements arrayed in a panel are driven directly by an electrode arranged in a matrix, or an active matrix in which a thin-film transistor is positioned on, and drives, each element. The former has a simpler structure, but there is a limit to the number of vertical pixels, and therefore these types of displays are typically used for displaying text or the like. The latter has a lower drive voltage, requires less current and yields a bright high-quality image, and is therefore typically used for high-quality displays.

Further, the illumination device includes the organic EL element described above. Moreover, the display device includes the illumination device and a liquid crystal element as a display unit. A display device that uses the illumination device as a backlight (white light emitting source) and uses a liquid crystal element as the display unit, namely a liquid crystal display device, is also possible. This configuration is merely a conventional liquid crystal display device in which only the backlight has been replaced with the aforementioned illumination device, with the liquid crystal element portion employing conventional technology.

[Organic Photoelectric Conversion Element]

Organic photoelectric conversion elements include organic solar cells and organic photosensors. A conventional organic photoelectric conversion element includes an anode, a photoelectric conversion layer and a cathode, in that order, and may also have other layers such as a buffer layer or an electron transport layer. The organic photoelectric conversion element may also have a substrate. On the other hand, the organic photoelectric conversion element that represents an embodiment of the present invention has a layer (A) having hole transport properties. This layer (A) having hole transport properties may, for example, function as the photoelectric conversion layer or as another layer, and is preferably used as a buffer layer. Accordingly, one example of the organic photoelectric conversion element includes, in order, an anode, the layer (A) having hole transport properties as a buffer layer, a photoelectric conversion layer and a cathode, and may also include other optional layers between the above layers. For example, the organic photoelectric conversion element has a surface to which an ionic compound has been adhered between the anode and the layer (A) having hole transport properties. The ionic compound may be adhered to the surface of the anode or the surface of the buffer layer. The anode, the buffer layer, the photoelectric conversion layer, the cathode and the substrate may use conventional materials, and can be provided using conventional methods.

The element structure and production method have been described above using the examples of an organic EL element and an organic photoelectric conversion element. However, in other organic electronic elements, a surface to which an ionic compound has been adhered may be provided between the anode and a layer having hole transport properties in a similar manner to that described above, and the thus obtained organic electronic element will exhibit excellent properties. The surface to which the ionic compound has been adhered enhances the properties of the layer having hole transport properties. Although the action of the ionic compound is not entirely clear, possibilities that have been considered include the ionic compound changing the energy level of the anode, thereby improving the injection of holes into the layer having hole transport properties, the ionic compound functioning as a charge transport path, thereby enhancing the hole injection properties and/or hole transport properties, and the ionic compound doping the surface of the layer having hole transport properties, thereby enhancing the hole injection properties and/or hole transport properties.

EXAMPLES

The embodiments of the present invention are described below in further detail using a series of examples, but the present invention is in no way limited by the following examples.

Preparation and Evaluation of Organic EL Elements

Example 1

An ionic compound 1 (10 mg) and toluene (1,000 µL) were mixed to obtain a composition (treatment liquid). The thus obtained composition was applied by spin coating at a revolution rate of 3,000 min' to a glass substrate on which ITO had been patterned with a width of 1.6 mm. Subsequently, the glass substrate was heated on a hotplate at 180° C. for 10 minutes.

[Chemical Formula 25]

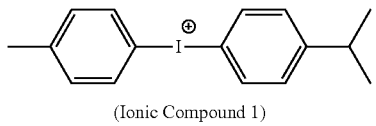

(Ionic Compound 1)

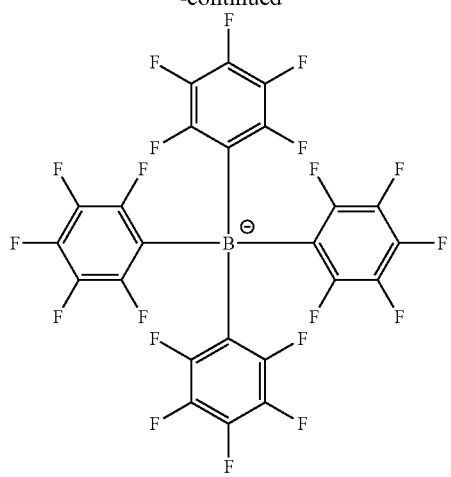

Next, the obtained glass substrate was transferred into a vacuum deposition apparatus, and α-NPD (film thickness: 50 nm), CBP+Ir(ppy)$_3$ (CBP:Ir(ppy)$_3$=100:6, film thickness: 30 nm), BAlq (film thickness: 10 nm), Alga (film thickness: 30 nm), LiF (film thickness: 0.8 nm) and Al (film thickness: 150 nm) were deposited in that order.

Following deposition, the glass substrate was transferred under a dry nitrogen atmosphere without exposure to the external atmosphere. Subsequently, an encapsulating glass having a countersink (namely, a concave portion) with a depth of 0.4 mm formed in an alkali-free glass with a thickness of 0.7 mm and the glass substrate were bonded together using a photocurable epoxy resin, thereby encapsulating and completing preparation of an organic EL element having a multilayer structure. Subsequent operations were performed in an open atmosphere at room temperature (25° C.).

When a voltage was applied to the organic EL element using the ITO as the anode and the Al as the cathode, a green light emission was observed at a voltage of 4 V. The current efficiency at a luminance of 1,000 cd/m$^2$ was 20 cd/A. The current-voltage characteristics were measured using a microammeter 4140B manufactured by Hewlett-Packard Company, and the emission luminance was measured using a luminance meter Pritchard 1980B manufactured by Photo Research, Inc.

Further, evaluation of the lifespan properties by measuring the time (lifespan) for the luminance to decrease to 70% of the initial luminance (3,000 cd/m$^2$) when a constant current was applied yielded a time of 24 hours. The emission luminance was measured using a luminance meter BM-7 manufactured by Topcon Technohouse Corporation.

Example 2

With the exception of replacing the ionic compound 1 with an ionic compound 2, an organic EL element was prepared using the same method as Example 1. The current efficiency for this organic EL element at a luminance of 1,000 cd/m$^2$ was 22 cd/A, and the lifespan was 32 hours.

[Chemical Formula 26]

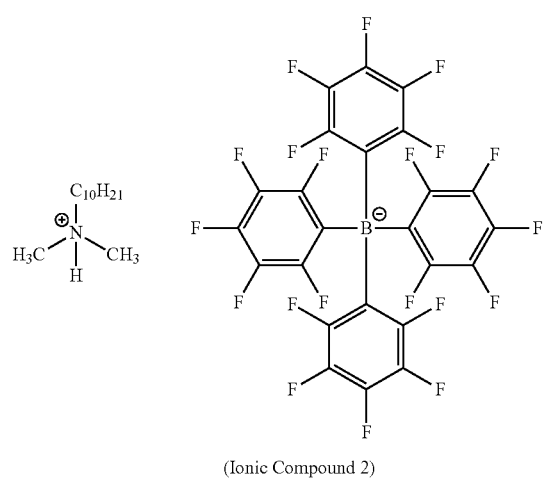

(Ionic Compound 2)

Example 3

The ionic compound 1 (10 mg), a compound 1 having a polymerizable substituent (10 mg, manufactured by Toagosei Co., Ltd.) and toluene (1,000 μL) were mixed to obtain a composition. The thus obtained composition was used to prepare an organic EL element using the same method as Example 1. The current efficiency for the obtained organic EL element at a luminance of 1,000 cd/m² was 22 cd/A, and the lifespan was 85 hours.

[Chemical Formula 27]

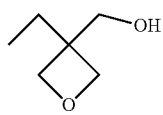

(Compound 1 having a polymerizable substituent)

Example 4

With the exception of replacing the compound 1 having a polymerizable substituent with a compound 2 having a polymerizable substituent (manufactured by Toagosei Co., Ltd.), an organic EL element was prepared using the same method as Example 3. The current efficiency for this organic EL element at a luminance of 1,000 cd/m² was 21 cd/A, and the lifespan was 64 hours.

[Chemical Formula 28]

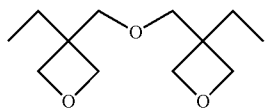

(Compound 2 having a polymerizable substituent)

Example 5

With the exception of replacing the compound 1 having a polymerizable substituent with a compound 3 having a polymerizable substituent (manufactured by Osaka Organic Chemical Industry Ltd.), an organic EL element was prepared using the same method as Example 3. The current efficiency for this organic EL element at a luminance of 1,000 cd/m² was 22 cd/A, and the lifespan was 80 hours.

[Chemical Formula 29]

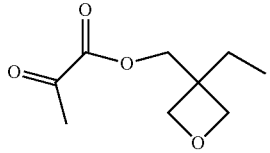

(Compound 3 having a polymerizable substituent)

Example 6

With the exception of replacing the compound 1 having a polymerizable substituent with a compound 4 having a polymerizable substituent (manufactured by New Japan Chemical Co., Ltd.), an organic EL element was prepared using the same method as Example 3. The current efficiency for this organic EL element at a luminance of 1,000 cd/m² was 22 cd/A, and the lifespan was 40 hours.

[Chemical Formula 30]

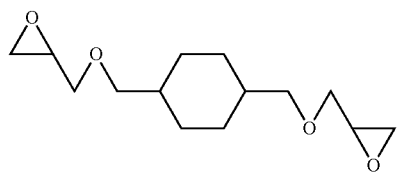

(Compound 4 having a polymerizable substituent)

Comparative Example 1

A glass substrate on which ITO had been patterned with a width of 1.6 mm was transferred into a vacuum deposition apparatus, and α-NPD (film thickness: 50 nm), CBP+Ir(ppy)$_3$ (CBP:Ir(ppy)$_3$=100:6, film thickness: 30 nm), BAlq (film thickness: 10 nm), Alga (film thickness: 30 nm), LiF (film thickness: 0.8 nm) and Al (film thickness: 150 nm) were deposited in that order on the substrate. Subsequent steps were performed in the same manner as Example 1 to complete preparation of an organic EL element. When a voltage was applied to the organic EL element, a green light emission was observed at 4 V. The current efficiency at a luminance of 1,000 cd/m² was 20 cd/A. Further, the lifespan was 2 hours.

The results are illustrated in Table 1. As illustrated in Table 1, the organic EL elements of Examples 1 to 6 each exhibited enhanced current efficiency and lifespan compared with the organic EL element of Comparative Example 1. By using the treatment liquid according to an embodiment of the present invention, an organic electronic element having excellent properties can be prepared.

TABLE 1

| | Ionic compound | Compound having polymerizable substituent | Current efficiency (cd/A) | Lifespan (hr) |
|---|---|---|---|---|
| Example 1 | 1 | — | 20 | 24 |
| Example 2 | 2 | — | 22 | 32 |
| Example 3 | 1 | 1 | 22 | 85 |
| Example 4 | 1 | 2 | 21 | 64 |
| Example 5 | 1 | 3 | 22 | 80 |
| Example 6 | 1 | 4 | 22 | 40 |
| Comparative Example 1 | — | — | 20 | 2 |

<Preparation and Evaluation of Elements for Evaluating Charge Transport Properties>

(Preparation of Pd Catalyst)

In a glove box under a nitrogen atmosphere and at room temperature, tris(dibenzylideneacetone)dipalladium (73.2 mg, 80 μmol) was weighed into a sample tube, anisole (15 mL) was added, and the resulting mixture was agitated for 30 minutes. In a similar manner, tri-tert-butylphosphine (129.6 mg, 640 μmol) was weighed into a sample tube, anisole (5 mL) was added, and the resulting mixture was agitated for 5 minutes. The two solutions were then mixed together and stirred for 30 minutes at room temperature to prepare a catalyst. All the solvents were deaerated by nitrogen bubbling for at least 30 minutes prior to use.

(Synthesis of Polymer A)

A three-neck round-bottom flask was charged with a monomer 1 shown below (2.0 mmol), a monomer 2 shown below (5.0 mmol), a monomer 3 shown below (4.0 mmol) and anisole (20 mL), and the prepared Pd catalyst solution (7.5 mL) was then added. After stirring for 30 minutes, a 10% aqueous solution of tetraethylammonium hydroxide (20 mL) was added. All the solvents were deaerated by nitrogen bubbling for at least 30 minutes prior to use. The resulting mixture was refluxed under heat for 2 hours. All the operations up to this point were conducted under a stream of nitrogen.

After completion of the reaction, the organic layer was washed with water, and the organic layer was then poured into methanol-water (9:1). The resulting precipitate was collected by suction filtration, and washed with methanol-water (9:1). The thus obtained precipitate was dissolved in toluene, and re-precipitated from methanol. The resulting precipitate was collected by suction filtration and dissolved in toluene, a metal absorbent (triphenylphosphine, polymer-bound on styrene-divinylbenzene copolymer, manufactured by Strem Chemicals Inc., 200 mg per 100 mg of precipitate) was added, and the resulting mixture was stirred overnight. Following completion of the overnight stirring, the metal absorbent and any insoluble matter were removed by filtration, and the filtrate was concentrated using a rotary evaporator. The concentrate was dissolved in toluene, and then re-precipitated from methanol-acetone (8:3). The generated precipitate was collected by suction filtration and washed with methanol-acetone (8:3). The resulting precipitate was then dried under vacuum to obtain a polymer A. The weight-average molecular weight was measured by GPC (relative to polystyrene standards) using THF as the eluent. The measurement conditions are described below. The thus obtained weight-average molecular weight for the polymer A was 31,000.

[Chemical Formula 3]

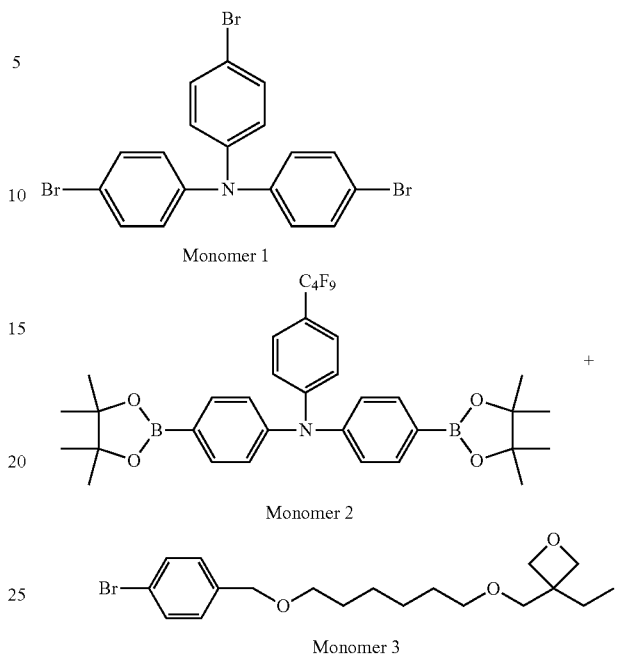

Monomer 1

Monomer 2

Monomer 3

The measurement conditions for measuring the weight-average molecular weight were as follows.

Liquid delivery pump: L-6050, manufactured by Hitachi High-Technologies Corporation UV-Vis detector: L-3000, manufactured by Hitachi High-Technologies Corporation Columns: Gelpack (®) GL-A160S/GL-A150S, manufactured by Hitachi Chemical Co., Ltd.

Eluent: THF (manufactured by Wako Pure Chemical Industries, Ltd., HPLC grade, containing no stabilizers)

Flow rate: 1 mL/min

Column temperature: room temperature

Molecular weight standards: standard polystyrenes

Example 7

The ionic compound 2 (5 mg) and toluene (1.1 mL) were mixed to obtain a composition. The thus obtained composition was applied by spin coating at a revolution rate of 3,000 $min^{-1}$ to a glass substrate on which ITO had been patterned with a width of 1.6 mm, and the glass substrate was then heated on a hotplate at 180° C. for 10 minutes. Meanwhile, the polymer A (50 mg) and toluene (1.1 mL) were mixed to obtain a composition. The thus obtained composition was applied by spin coating at a revolution rate of 3,000 $min^{-1}$ to the glass substrate. The substrate was then heated on a hotplate at 180° C. for 10 minutes to complete preparation of a charge transport film (150 nm). Next, the thus obtained glass substrate was transferred to a vacuum deposition apparatus, and a film of aluminum (film thickness: 100 nm) was deposited. Following the aluminum deposition, the glass substrate was transferred under a dry nitrogen atmosphere without exposure to the external atmosphere. Subsequently, an encapsulating glass having a countersink (namely, a concave portion) with a depth of 0.4 mm formed in an alkali-free glass with a thickness of 0.7 mm and the glass substrate were bonded together using a photocurable epoxy resin, thereby encapsulating and completing preparation of an element for evaluating the charge transport properties.

Example 8

The ionic compound 2 (5 mg), the compound 1 having a polymerizable substituent (5 mg) and toluene (1.1 mL) were mixed to obtain a composition. With the exception of using this composition instead of the composition obtained from the ionic compound 2 and toluene, an element for evaluating the charge transport properties was obtained in the same manner as Example 7.

Comparative Example 2

The polymer A (50 mg) and toluene (1.1 mL) were mixed to prepare a composition. With the exception of applying this composition directly to a glass substrate on which ITO had been patterned with a width of 1.6 mm, without first applying the composition obtained from the ionic compound 2 and toluene, an element for evaluating the charge transport properties was obtained in the same manner as Example 7.

Figure 5:
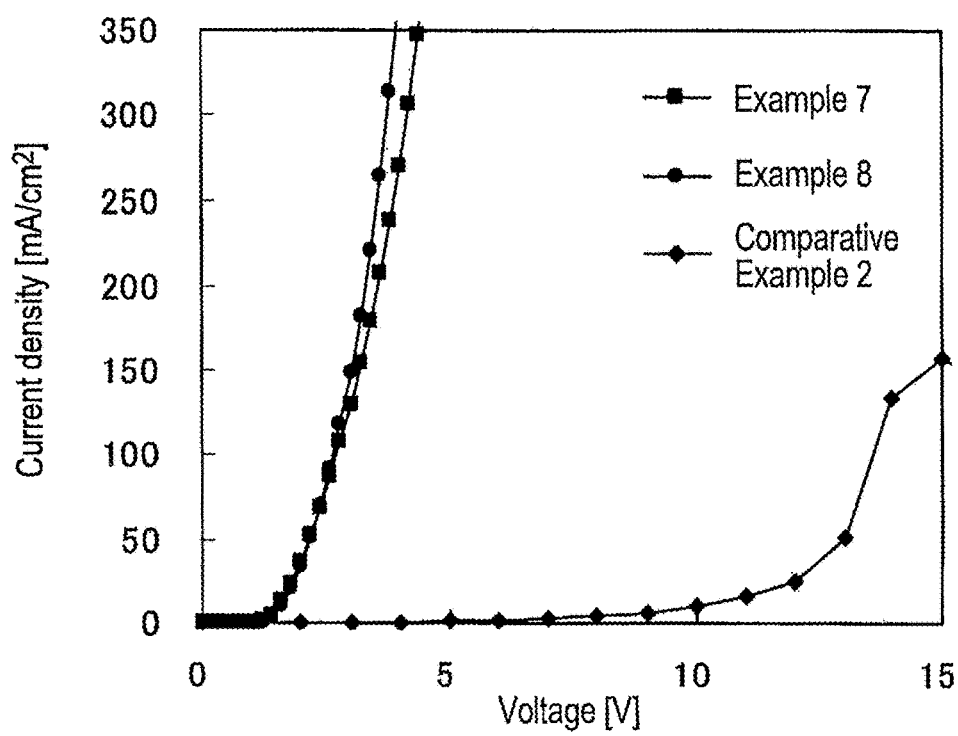
FIG. 5 is a graph illustrating the evaluation results for charge transport evaluation elements prepared in the examples.

For each of the elements for evaluating charge transport properties obtained in Examples 7 and 8 and Comparative Example 2, a voltage was applied using the ITO as the anode and the aluminum as the cathode, and the current-voltage characteristics were evaluated. The evaluation results are shown in FIG. 5. As illustrated in FIG. 5, the elements for evaluating charge transport properties obtained in Examples 7 and 8 exhibited enhanced charge transport properties compared with the element for evaluating charge transport properties obtained in Comparative Example 2. By using the treatment liquid according to an embodiment of the present invention, an organic electronic element that can be driven at a lower voltage can be prepared.

The effects of the embodiments of the present invention have been illustrated above using a series of examples. Even for elements other than those described in the examples, by using the ionic compound, similar superior effects can be obtained. In other words, according to the various embodiments of the present invention, the properties of organic electronic elements can be easily improved.

REFERENCE SIGNS LIST

1: Anode
2: Coating film
3: Layer (A) having hole transport properties
4: Light-emitting layer
5: Cathode
6: Substrate
7: Layer (B) having hole transport properties
1a: Surface to which ionic compound is adhered (surface of anode)
7a: Surface to which ionic compound is adhered (surface of layer (B) having hole transport properties)

The invention claimed is:

1. A method for producing an organic electronic element comprising:
   a step of forming an anode,
   a step of forming a layer (A) having hole transport properties, and
   a step of forming a cathode,
the method further comprising at least one step selected from the group consisting of:
   a step of adhering a material comprising an ionic compound to a surface on which the layer (A) having hole transport properties is to be formed, and
   a step of adhering a material comprising an ionic compound to a surface of the layer (A) having hole transport properties,
wherein the material comprising the ionic compound does not contain more than 0.1 part by mass of a compound having hole transport properties relative to 1 part by mass of the ionic compound, and wherein the ionic compound has at least one anion selected from the group consisting of anions represented by any one of the following formulae (1A), (2A), (3A), and (5A);

(1A)

(2A)

(3A)

(5A)

wherein $E^1$ represents an oxygen atom, $E^2$ represents a nitrogen atom, $E^3$ represents a carbon atom, and $E^5$ represents a phosphorus atom or an antimony atom, each of $Y^1$ to $Y^6$ independently represents a single bond or a divalent linking group, and each of $R^1$ to $R^6$ and $R^{11}$ to $R^{16}$ independently represents an electron-withdrawing monovalent group (wherein $R^2$ and $R^3$, at least two groups selected from among $R^4$ to $R^6$, and at least two groups selected from among $R^{11}$ to $R^{16}$ may be bonded together).

2. The method for producing an organic electronic element according to claim 1, wherein the material comprising the ionic compound does not contain more than 0.01 parts by mass of a compound having hole transport properties relative to 1 part by mass of the ionic compound.

3. The method for producing an organic electronic element according to claim 1, wherein the material comprising the ionic compound does not contain a compound having hole transport properties.

4. A method for producing an organic electronic element comprising the following set of steps (1) in order, or set of steps (2) in order:
   (1) a step of forming an anode,
      a step of adhering a material comprising an ionic compound to a surface of the anode by applying a treatment liquid comprising the ionic compound and a solvent to the surface of the anode,
      a step of forming a layer (A) having hole transport properties on the surface of the anode to which the treatment liquid has been applied, and
      a step of forming a cathode, or
   (2) a step of forming an anode,
      a step of forming a layer (B) having hole transport properties,
      a step of adhering a material comprising an ionic compound to a surface of the layer (B) having hole transport properties by applying a treatment liquid comprising the ionic compound and a solvent to the surface of the layer (B) having hole transport properties, a step of forming a layer (A) having hole transport properties on the surface of the layer (B) having hole transport properties to which the treatment liquid has been applied, and a step of forming a cathode, wherein the material comprising the ionic compound does not contain more than 0.1 part by mass of a compound having hole transport properties relative to 1 part by mass of the ionic compound, wherein the treatment liquid does not contain more than 0.1 part by mass of a compound having hole transport properties relative to 1 part by mass of the ionic compound, and wherein the ionic compound comprises at least one selected from the group consisting of:

anions represented by any one of the following formulae (1A), (2A), (3A), and (5A):

(1A)

(2A)

(3A)

(5A)

wherein $E^1$ represents an oxygen atom, $E^2$ represents a nitrogen atom, $E^3$ represents a carbon atom, and $E^5$ represents a phosphorus atom or an antimony atom, each of $Y^1$ to $Y^6$ independently represents a single bond or a divalent linking group, and each of $R^1$ to $R^6$ and $R^{11}$ to $R^{16}$ independently represents an electron-withdrawing monovalent group (wherein $R^2$ and $R^3$, at least two groups selected from among $R^4$ to $R^6$, and at least two groups selected from among $R^{11}$ to $R^{16}$ may be bonded together);

cations of elements belonging to group 1 or group 2 of the IUPAC Periodic Table of the Elements; and cations represented by any one of the following formulae (1B), (2B) and (3B):

(1B)

(2B)

(3B)

wherein $A^1$ represents an element belonging to group 17 or group 14 of the IUPAC Periodic Table of the Elements, $A^2$ represents an element belonging to group 16 or group 14 of the IUPAC Periodic Table of the Elements, $A^3$ represents an element belonging to group 15 of the IUPAC Periodic Table of the Elements, and each of $R^1$ to $R^9$ independently represents a hydrogen atom or an organic group (wherein $R^1$ and $R^2$, at least two groups selected from among $R^3$ to $R^5$, and at least two groups selected from among $R^6$ to $R^9$ may be bonded together).

5. The method for producing an organic electronic element according to claim 4, wherein the ionic compound has at least one cation selected from the group consisting of cations of elements belonging to group 1 or group 2 of the IUPAC Periodic Table of Elements, and cations represented by any one of of the formulae (1B), (2B) and (3B).

6. The method for producing an organic electronic element according to claim 4, further comprising a step of forming a light-emitting layer.

7. An organic electronic element prepared using the method for producing an organic electronic element according to claim 4.

8. The method for producing an organic electronic element according to claim 4, wherein the treatment liquid comprising the ionic compound and a solvent does not contain more than 0.01 parts by mass of a compound having hole transport properties relative to 1 part by mass of the ionic compound.

9. The method for producing an organic electronic element according to claim 4, wherein the treatment liquid comprising the ionic compound and a solvent does not contain a compound having hole transport properties.

10. A method for producing an organic electronic element comprising:

a step of forming an anode, a step of forming a layer (A) having hole transport properties, and a step of forming a cathode, the method further comprising at least one step selected from the group consisting of:

a step of adhering a material comprising an ionic compound to a surface on which the layer (A) having hole transport properties is to be formed, and a step of adhering a material comprising an ionic compound to a surface of the layer (A) having hole transport properties, wherein the step of adhering the material comprising the ionic compound is a step of applying a treatment liquid comprising the ionic compound, a compound having a polymerizable substituent and a solvent, wherein the treatment liquid does not contain more than 0.1 part by mass of a compound having hole transport properties relative to 1 part by mass of the ionic compound, wherein the material comprising the ionic compound does not contain more than 0.1 part by mass of a compound having hole transport properties relative to 1 part by mass of the ionic compound, and wherein the ionic compound comprises at least one selected from the group consisting of:

anions represented by any one of the following formulae (1A), (2A), (3A), and (5A):

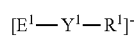 (1A)

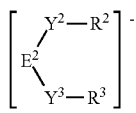 (2A)

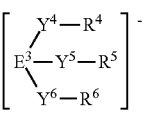 (3A)

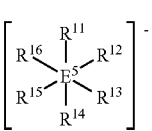 (5A)

wherein $E^1$ represents an oxygen atom, $E^2$ represents a nitrogen atom, $E^3$ represents a carbon atom, and $E^5$ represents a phosphorus atom or an antimony atom, each of $Y^1$ to $Y^6$ independently represents a single bond or a divalent linking group, and each of $R^1$ to $R^6$ and $R^{11}$ to $R^{16}$ independently represents an electron-withdrawing monovalent group (wherein $R^2$ and $R^3$, at least two groups selected from among $R^4$ to $R^6$, and at least two groups selected from among $R^{11}$ to $R^{16}$ may be bonded together);

cations of elements belonging to group 1 or group 2 of the IUPAC Periodic Table of the Elements; and cations represented by any one of the following formulae (1B), (2B) and (3B):

 (1B)

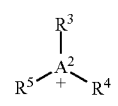 (2B)

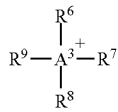 (3B)

wherein $A^1$ represents an element belonging to group 17 or group 14 of the IUPAC Periodic Table of the Elements, $A^2$ represents an element belonging to group 16 or group 14 of the IUPAC Periodic Table of the Elements, $A^3$ represents an element belonging to group 15 of the IUPAC Periodic Table of the Elements, and each of $R^1$ to $R^9$ independently represents a hydrogen atom or an organic group (wherein $R^1$ and $R^2$, at least two groups selected from among $R^3$ to $R^5$, and at least two groups selected from among $R^6$ to $R^9$ may be bonded together).

11. The method for producing an organic electronic element according to claim 10, wherein the treatment liquid comprising the ionic compound and a solvent does not contain more than 0.01 parts by mass of a compound having hole transport properties relative to 1 part by mass of the ionic compound.

12. The method for producing an organic electronic element according to claim 10, wherein the treatment liquid comprising the ionic compound and a solvent does not contain a compound having hole transport properties.

13. A method for producing an organic electronic element comprising:
    a step of forming an anode,
    a step of forming a layer (A) having hole transport properties, and
    a step of forming a cathode,
the method further comprising at least one step selected from the group consisting of:
    a step of adhering a material comprising an ionic compound to a surface on which the layer (A) having hole transport properties is to be formed, and
    a step of adhering a material comprising an ionic compound to a surface of the layer (A) having hole transport properties,
wherein the material comprising the ionic compound does not contain more than 0.1 part by mass of a compound having hole transport properties relative to 1 part by mass of the ionic compound, and wherein the ionic compound comprises:
    at least one anion selected from the group consisting of anions represented by any one of the following formulae (1A), (2A), (3A), (4A) and (5A):

 (1A)

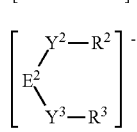 (2A)

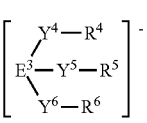 (3A)

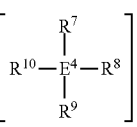 (4A)

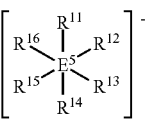 (5A)

wherein $E^1$ represents an oxygen atom, $E^2$ represents a nitrogen atom, $E^3$ represents a carbon atom, $E^4$ represents a boron atom or a gallium atom, and $E^5$ represents a phosphorus atom or an antimony atom, each of $Y^1$ to $Y^6$ independently represents a single bond or a divalent linking group, and each of $R^1$ to $R^{16}$ independently represents an electron-withdrawing monovalent group (wherein $R^2$ and $R^3$, at least two groups selected from among $R^4$ to $R^6$, at least two groups selected from among $R^7$ to $R^{10}$, and at least two groups selected from among $R^{11}$ to $R^{16}$ may be bonded together), and at least one cation selected from the group consisting of cations of elements belonging to group 1 or group 2 of the IUPAC Periodic Table of the Elements, and cations represented by any one of the following formulae (1B), (2B) and (3B):

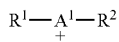 (1B)

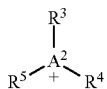 (2B)

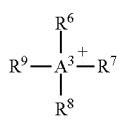 (3B)

wherein $A^1$ represents an element belonging to group 17 or group 14 of the IUPAC Periodic Table of the Elements, $A^2$ represents an element belonging to group 16 or group 14 of the IUPAC Periodic Table of the Elements, $A^3$ represents an element belonging to group 15 of the IUPAC Periodic Table of the Elements, and each of $R^1$ to $R^9$ independently represents a hydrogen atom or an organic group (wherein $R^1$ and $R^2$, at least two groups selected from among $R^3$ to $R^5$, and at least two groups selected from among $R^6$ to $R^9$ may be bonded together).

14. The method for producing an organic electronic element according to claim 13, wherein the material comprising the ionic compound does not contain more than 0.01 parts by mass of a compound having hole transport properties relative to 1 part by mass of the ionic compound.

15. The method for producing an organic electronic element according to claim 13, wherein the material comprising the ionic compound does not contain a compound having hole transport properties.

* * * * *